United States Patent
Carroll et al.

(10) Patent No.: US 7,039,083 B2
(45) Date of Patent: May 2, 2006

(54) HIGH SPEED OPTICAL TRANSMISSION ASSEMBLY

(75) Inventors: Chris H. Carroll, Santa Clara, CA (US); Shiming Wang, Fremont, CA (US); Yu Chung Chang, Cupertino, CA (US); Joseph Indhiran Vanniasinkam, Toronto (CA)

(73) Assignee: Opnext, Inc., Fremont, CA (US)

( * ) Notice: Subject to any disclaimer, the term of this patent is extended or adjusted under 35 U.S.C. 154(b) by 199 days.

(21) Appl. No.: 10/387,926

(22) Filed: Mar. 12, 2003

(65) Prior Publication Data
US 2004/0179562 A1 Sep. 16, 2004

(51) Int. Cl.
*H01S 3/04* (2006.01)

(52) U.S. Cl. .......................... 372/36; 372/34
(58) Field of Classification Search ............. 372/34, 372/36; 398/138; 385/92–95
See application file for complete search history.

(56) References Cited

U.S. PATENT DOCUMENTS

| 4,615,031 | A | * | 9/1986 | Eales et al. ............. 372/36 |
| 4,769,684 | A | * | 9/1988 | Crocker et al. ............ 257/99 |
| 5,748,658 | A | * | 5/1998 | Nakanishi et al. ......... 372/43 |
| 6,049,073 | A | * | 4/2000 | Roddy et al. ............. 250/205 |
| 6,155,724 | A | * | 12/2000 | Ichino et al. ............. 385/92 |
| 6,301,278 | B1 | * | 10/2001 | Uchida ..................... 372/36 |
| 6,703,561 | B1 | * | 3/2004 | Rosenberg et al. ...... 174/52.5 |
| 6,773,532 | B1 | * | 8/2004 | Wolf et al. ............... 156/182 |
| 6,781,727 | B1 | * | 8/2004 | Auracher et al. ......... 398/163 |
| 6,841,733 | B1 | * | 1/2005 | Schiaffino et al. ....... 174/52.5 |
| 2003/0043868 | A1 | * | 3/2003 | Stewart et al. ............ 372/36 |
| 2004/0081410 | A1 | * | 4/2004 | Aronson et al. ........... 385/92 |

* cited by examiner

*Primary Examiner*—Minsun Oh Harvey
*Assistant Examiner*—Phillip Nguyen
(74) *Attorney, Agent, or Firm*—Finnegan, Henderson, Farabow, Garrett & Dunner, L.L.P.

(57) ABSTRACT

An optical assembly that can be utilized as a transmitter in a high data rate optical transceiver system is presented. The optical assembly allows a laser driver to be mounted near the laser and allows the laser driver and the laser to utilize a common heat sink. Further, assembly can be performed reliably and quickly to reduce the cost of production of the optical assembly.

17 Claims, 28 Drawing Sheets

FIG. 4B
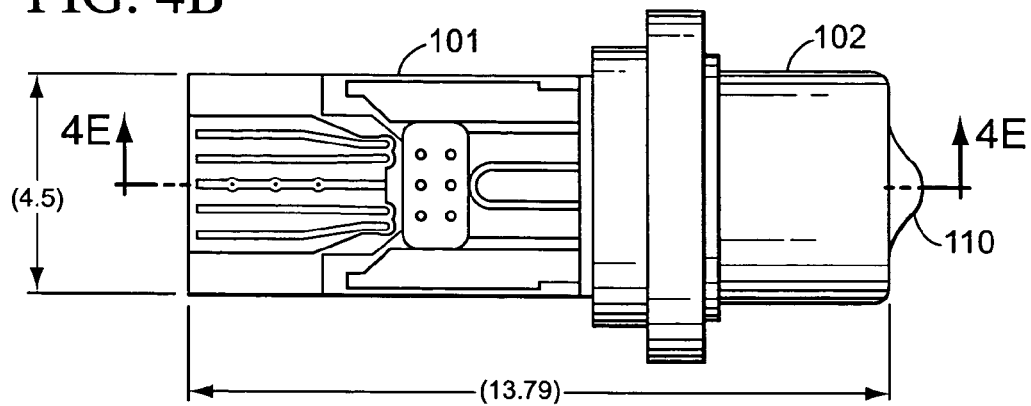
FIG. 4C
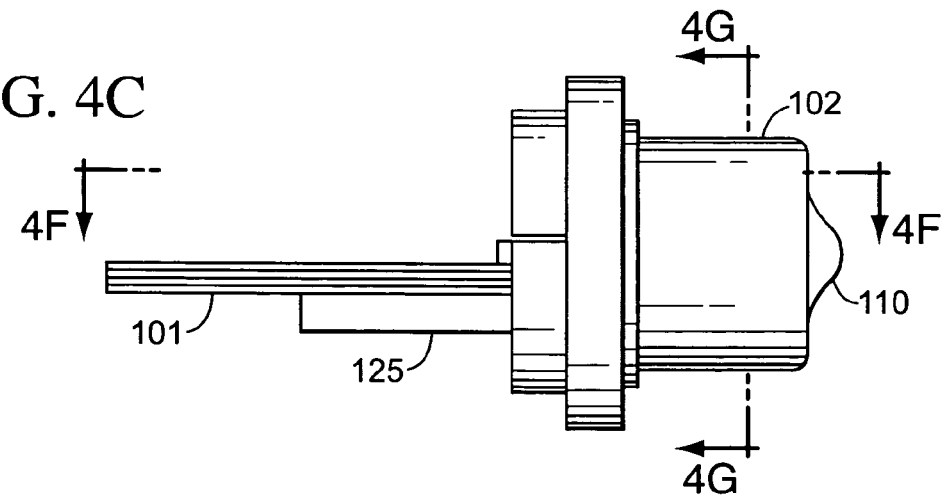
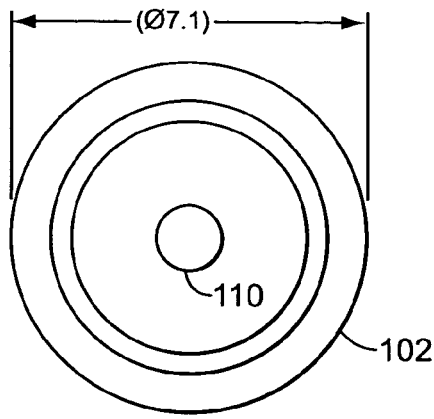
FIG. 4D

HIGH SPEED OPTICAL TRANSMISSION ASSEMBLY

BACKGROUND

1. Field of the Invention

The present invention is directed towards an optical assembly and, in particular, an optical assembly capable of high speed data transmission.

2. Discussion of Related Art

As data rates increase, the need for components that can accommodate those data rates also increase. Further, there is great interest in providing low-cost transceiver components that support high data rates in small form-factor packages.

Coaxially arranged optical assemblies, such as the TO-56 packages for example, are common standard form-factors for housing optical network components. The TO-56 package allows for coupling, with an optical coupler, to an optical fiber communication line. This coaxial style packaging for optical coupling with optical fiber provides a cost effective solution for many transceiver applications. However, as data rates increase (especially beyond the 2.5 Gbps range), a new solution is needed to achieve high performance. As the higher performance is attained, however, the cost of producing high-performance optoelectronic packages can increase dramatically.

Several problems arise when high performance optoelectronic devices are assembled in small form-factor packages. For example, the thermal properties of the device become more problematic as high performance devices may generate more heat than is comfortably dissipated by a small package. Further, due to impedance mismatches and other electronic effects, high speed data signals may be degraded between, for example, a laser driver and a laser. Optical alignments also become more critical at higher data rates because loss of the small tolerances associated with high bandwidth optical transmission can become more of a problem. All of these issues can make it difficult to manufacture high performance optoelectronic devices at low cost.

Therefore, there is a need for transceiver components in small coaxial style package that both perform well at high data rates (for example above about 2.5 Gbps) and that are manufacturable at low cost.

SUMMARY

In accordance with the present invention, a high performance coaxial style packaged transceiver assembly with low manufacturing cost is presented. In some embodiments the transceiver assembly includes a laser driver and a laser submount, wherein the laser driver IC is mounted on an interface board and then mounted on the same heatsink material as is the laser submount. In some embodiments, the assembly provides for a high performance transmission system in a coaxial style packaging. An optical assembly according to the present invention can include a feed-through assembly, the feed-through assembly including an access for a laser driver and a heat sink, and a laser assembly mounted on the heat sink, wherein the access for the laser driver and the laser assembly are both thermally coupled to the heat sink.

In some embodiments of the invention, the output impedance of the laser driver is matched to the combined impedance of the laser and matching assembly to lower power consumption of the transceiver package. Further, in some embodiments the integrated resistor and laser submount are directly mounted on a heatsink, thereby improving high temperature performance by thermally conducting heat through the heat sink rather than through the electrical leads. In some embodiments, the thermal paths of the laser driver and the laser are sufficiently isolated to allow for efficient thermal dissipation without interference from the laser driver. In other words, in some embodiments, the thermal paths and proximity of the laser driver and the laser are balanced. In some embodiments, this balance can be achieved by sacrificing lowest-possible laser driver temperatures in order to achieve the lowest laser temperatures while maintaining acceptable electrical performance.

In some embodiments, the transceiver assembly includes a thin film spiral inductor placed with the laser die on the submount to minimize the stub length seen by the high speed signal at the laser input, achieving high signal performance.

In some embodiments, final optical alignment is obtained by typing the optical assembly according to the assembled location of the laser emission with respect to a nominal laser emitter location within the optical assembly. A lens cap, which includes a ball lens, can then be positioned with respect to the laser assembly in response to the type of optical assembly. This process results in a higher yield of high performance devices.

Since a laser driver can be positioned very close to the laser, and since impedance matching to the combination of resistor and laser can be accomplished with an inductor positioned close to the laser, signal distortion between the laser driver and the laser can be much reduced. Further, in some embodiments, electrical traces instead of individual pins carry signals throughout the optical assembly. The electrical characteristics of electrical traces can be better controlled than pins and contributes to the high performance of optical assemblies according to the present invention. The reduction in signal distortion allows for high performance optical assemblies to be constructed in a small standard package.

A method of producing an optical assembly according to the present invention can include forming a feed-through assembly, the feed-through assembly including an access for a laser driver wherein the laser driver will be thermally coupled to a heat sink; forming a laser assembly; and mounting the laser assembly on the feed-through assembly such that the laser assembly is thermally coupled to the heat sink.

These and other embodiments are further described below with respect to the following figures.

DESCRIPTION OF THE FIGURES

FIGS. 4A through 4I illustrate layout and assembly of an embodiment of optical assembly 100 according to the present invention.

Elements having the same designation in the figures have the same or similar functions.

DETAILED DESCRIPTION

Figure 1A:
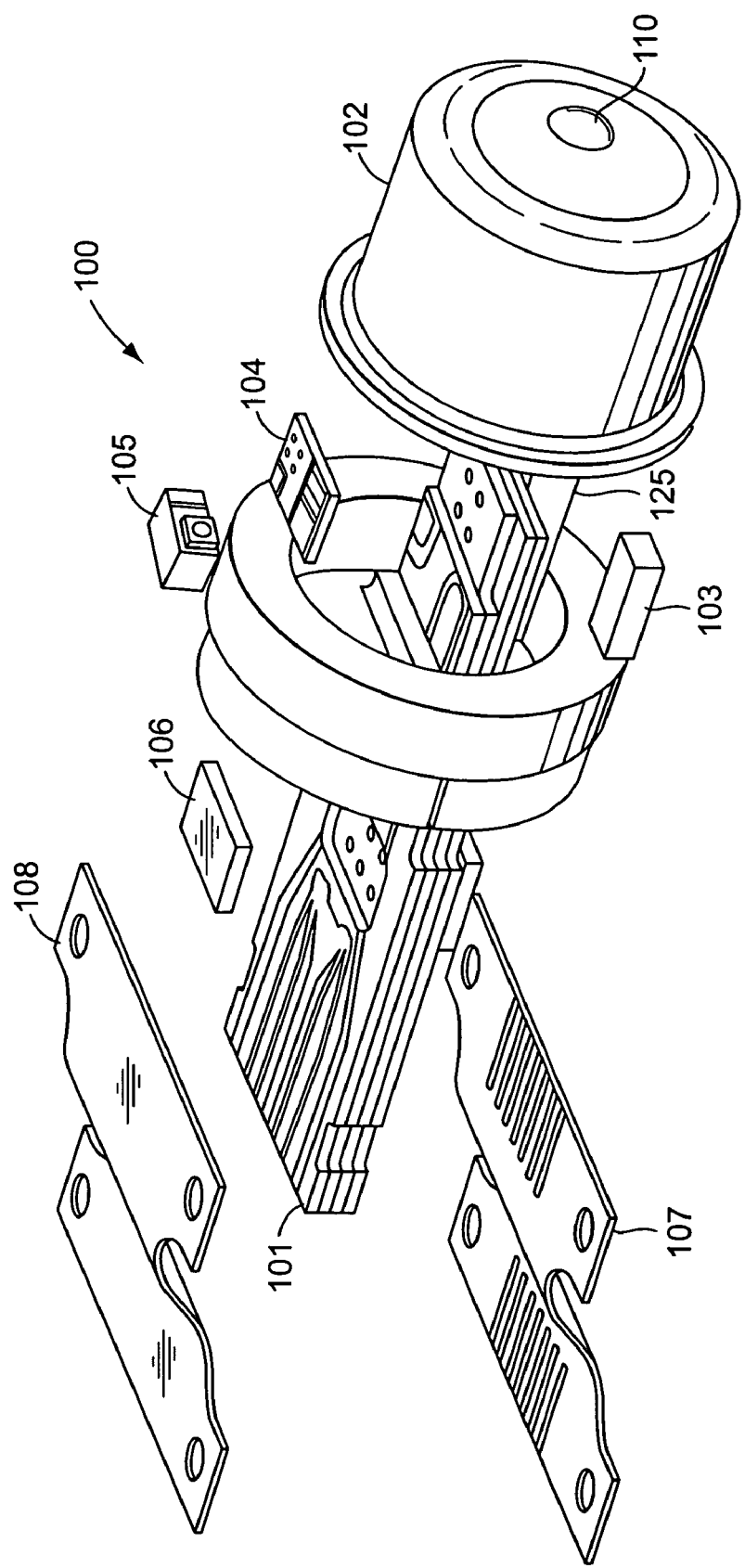
FIG. 1A shows an embodiment of an optical assembly according to the present invention.

FIG. 1A illustrates an optical assembly 100 according to the present invention. Optical assembly 100 includes a feed-through assembly 101 and a lens cap 102. Lens cap 102 can, in some embodiments, be attached with feed-through assembly 101 to form a hermetic seal. In some embodiments, a photo diode assembly 105 and laser assembly 104 are mounted to feed-through assembly 101 and enclosed with lens cap 102. Lens cap 102 further includes a lens 110, which in some embodiments is a ball lens, in order to couple light from laser assembly 104 into an optical fiber. In some embodiments, further components can be included within and without the area sealed by feed-through assembly 101 and lens cap 102. For example, an impedance matching inductor 103 can be mounted to feed-through assembly 101 within the area sealed by feed-through assembly 101 and lens cap 102. Further, feed-through assembly 101 can include a mounting access 129 for a laser driver 106. Laser driver 106, in some embodiments, can receive digital data signals and drive a laser of laser assembly 104 to produce a corresponding optical signal.

In some embodiments, laser assembly 104 can be mounted directly on a heat sink 125. Heat sink 125 is part of feed-through assembly 101. In some embodiments, laser assembly 104 is mounted on ceramic layers of feed-through assembly 101, as shown in FIG. 1A, and thermally coupled to heat sink 125.

During assembly, optical assembly 100 can be "typed" according to the offset of the laser emission laser assembly 104 after laser assembly 104 is attached to feed-through 101. Cap 102 can then be positioned and attached to feed-through 101 in accordance with the type of optical assembly 100.

In some embodiments, brackets 107 and 108 can be provided to mechanically attach feed-through 101 to a ceramic layer (not shown). Further, brackets 107 and 108 can be electrically coupled to conducting traces formed on feed-through 101 to electrically couple optical assembly 100 to a ceramic layer (not shown).

Figure 1B:
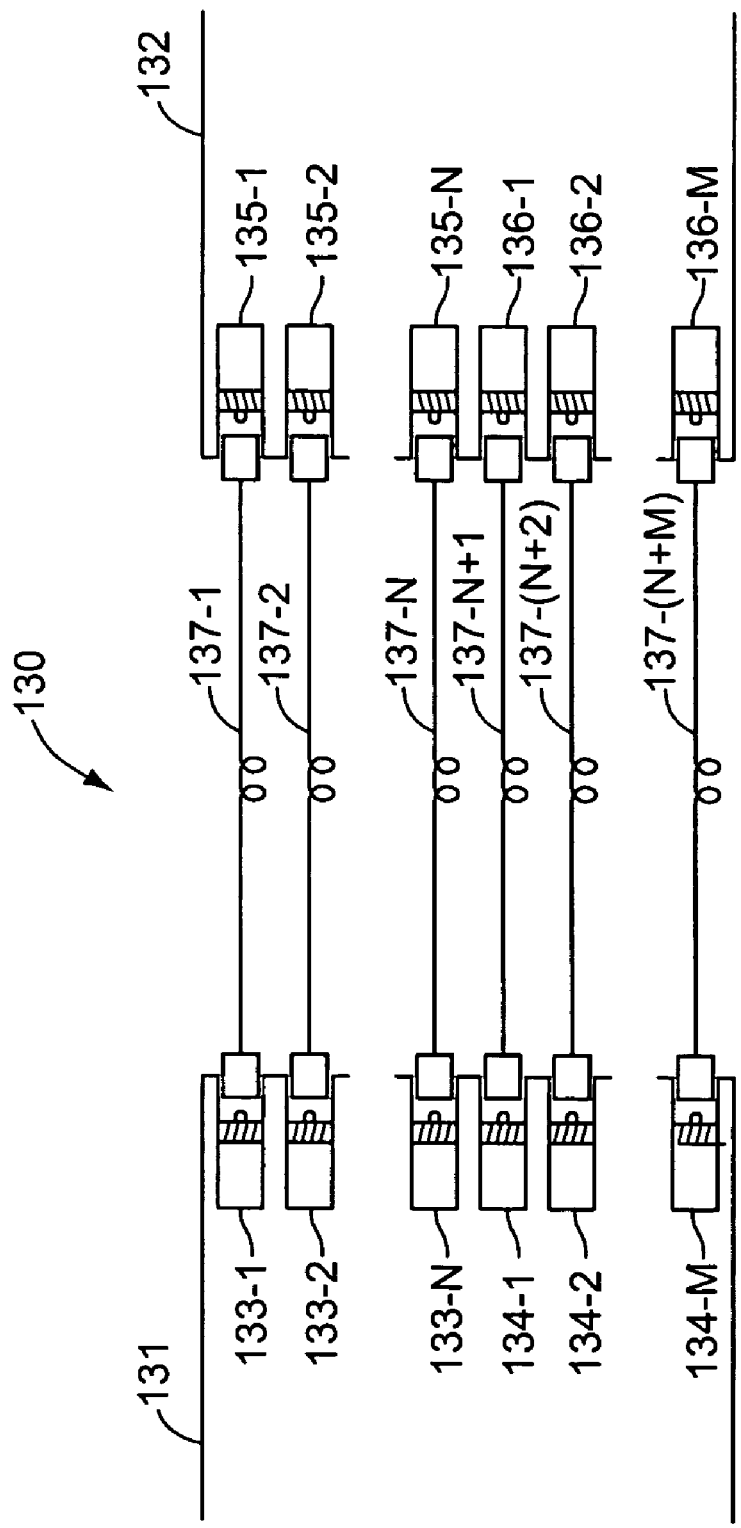
FIG. 1B shows an optical and electrical block diagram of the optical assembly shown in FIG. 1A.

FIG. 1B shows an example transceiver system 130 that can utilize one or more devices such as optical assembly 100 illustrated in FIG. 1A. Transceiver system 130 includes transceivers 131 and 132 optically coupled through optical fiber 137-1 through 137-(N+M). Each of optical fibers 137-1 through 137-(N+M) include connectors that are optically coupled to transceivers 131 and 132. Transceiver 131 includes transmitters 133-1 through 133-N, each of which is optically coupled to a corresponding one of receivers 135-1 through 135-N of transceiver 132. Further, transceiver 131 includes receivers 134-1 through 134-M, each of which is optically coupled to a corresponding one of transmitters 136-1 through 136-M of transceiver 132. Transceiver 131 can include any number of transmitters N and any number of receivers M. Typically, for many commercial systems, the number of transmitters N and the number of receivers M are both 1. One or more of transmitters 133-1 through 133-N and 136-1 through 136-M include an optical assembly 100 according to the present invention. The receiver portions of transceiver system 130, i.e. receivers 134-1 through 134-N and 136-1 through 136-M, includes a photodetector system and electrical filter/driver for receiving optical signals from an optical fiber.

Figure 1C:
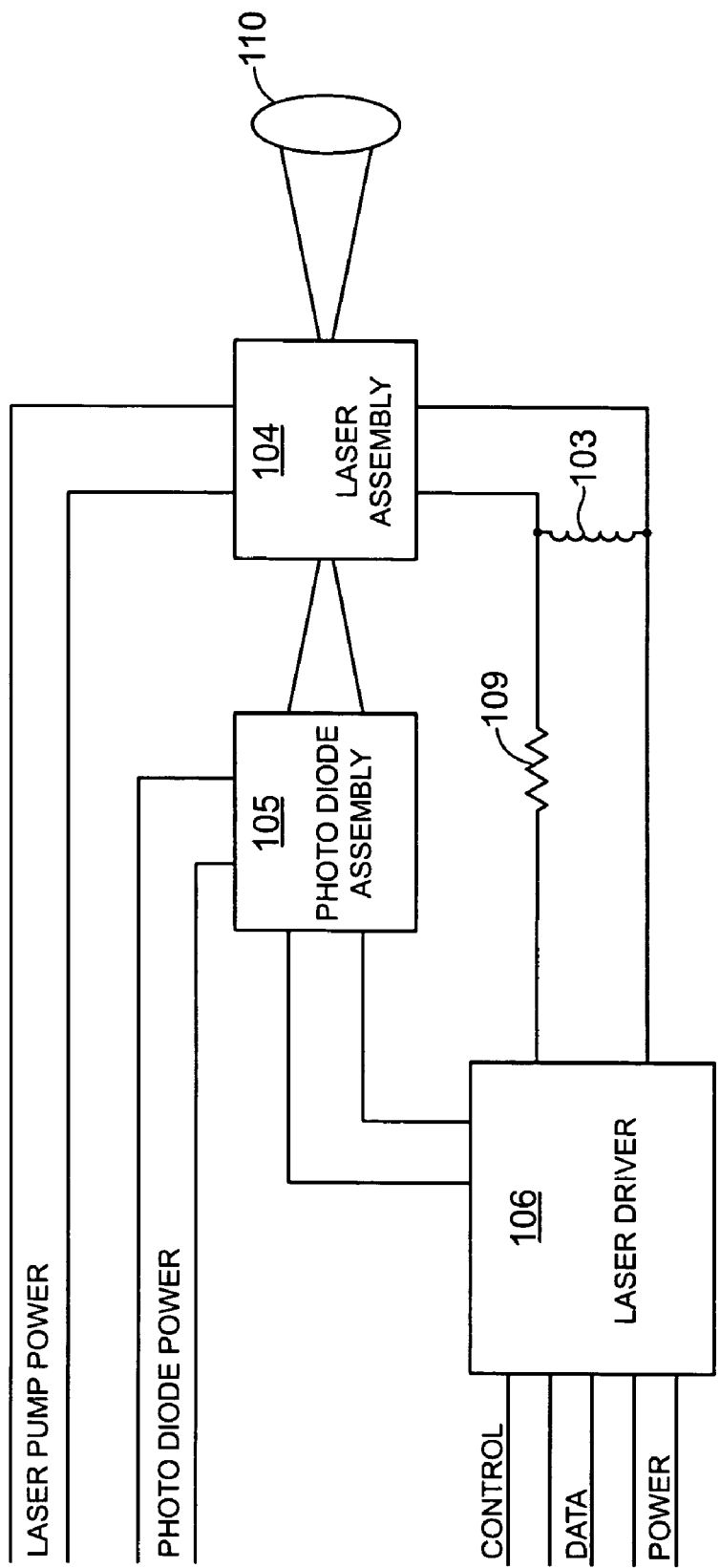
FIG. 1C shows an optical and electrical diagram for the circuits of the optical assembly illustrated in FIGS. 1A and 1B.

FIG. 1C shows an optical and electrical diagram for the circuits of optical assembly 100. As shown in FIG. 1C, a laser driver 106 is coupled to laser assembly 104. Laser assembly 104 includes a laser which provides optical output. The optical output from laser assembly 104 is captured by a ball lens 110 on end cap 102 (see FIG. 1A) to couple light into an optical fiber (see FIG. 1B). Photo diode assembly 105 captures light from laser assembly 104 and provides electrical feedback to laser driver 106. Photodiode assembly 105 and laser assembly 104 are coupled to photodiode power and laser pump power through conductors provided on feed-through assembly 101 shown in FIG. 1A. Control, data, and power are also provided to laser driver 106 through conductors provided on feed-through assembly 101.

Laser assembly 104 can be any source of light that can be modulated in response to a signal from laser driver 106. In some embodiments, laser assembly 104 can be a Mitsubishi Electric and Electronics model ML792H28 laser. In some embodiments, optical laser assembly 104 can be an uncooled InGaAsP 1310 nm DFB laser. The wavelength of light output by laser assembly 104, in some embodiments, is nominally 1310 nm (e.g. about 1290 to about 1330 nm); however, laser assembly 104 may produce any other central wavelength.

Laser driver 106 can be any circuit that converts a received digital signal to a signal appropriate for modulating the laser of laser assembly 104. In some embodiments, laser driver 106 can be a Maxim Max3932E/D driver (Maxim Corporate Headquarters, 120 San Gabriel Drive, Sunnyvale, Calif. 94086).

In some embodiments, laser driver 106 and laser assembly 104 are mounted on the same interface board of feed-through assembly 101. In some embodiments, laser driver 106 is mounted on a ceramic substrate of assembly 101, which is mounted on heat sink 125, while laser assembly 104 is mounted directly on heat sink 125 (see FIG. 1A). Reducing the distance between laser driver 106 and laser assembly 104 by mounting the two components on the feed-through assembly 101 allows for higher data rates by shortening the transmission distance between laser driver 106 and laser 104.

As shown in FIG. 1C, impedance matching between the output impedance of laser driver 106 and the input impedance of laser assembly 104 is accomplished by resistor 109 and inductor 103. In some embodiments, resistor 109 and laser assembly 104 are mounted directly on heat sink 125, which can result in an improved high temperature performance. Thermal conduction through heat sink 125 instead of through conducting leads or traces reduces the amount of electrical interference caused by thermal effects in the leads. Further, matching the output impedance of laser driver 106 to the combined impedance of the laser of laser assembly 104 and matching resistor 109 results in lower power consumption of resistor 109. For example, matching a 20 Ohm output impedance of laser driver 106 to resistor 109 and the input impedance of laser assembly 104 results in lower power consumption by resistor 109 than does matching the 50 Ohm output impedance of the combination of laser driver 106 and resistor 109 with the input impedance of laser assembly 104.

Inductor 103 may be a microwave spiral inductor such as that produced by US Microwave L10 62nH-20Q case 30×30 (US Microwaves, 2964–2966 Scott Blvd., Santa Clara, Calif. 95054), for example. Mounting inductor 103 adjacent to laser assembly 104 on feed-through assembly 101 and, in some embodiments directly onto laser assembly 104, can minimize the stub length, and hence the additional impedance due to the length of the conductor coupling laser driver 106 with the input terminal of laser assembly 104. The reduced stub length can aid in high data rate performance. Further, utilizing a thin film spiral inductor, inductor 103 can be placed within a small package such as the TO-56 standard package. In some embodiments, inductor 103 can be mounted on laser assembly 104.

FIGS. 2A through 2D illustrate the physical, optical, and electrical configuration of an embodiment of optical assembly 100 with photodiode assembly 105 and laser assembly 104 on feed-through assembly 101. As shown, laser assembly 104, with laser 119, is mounted such as to provide optical coupling. Laser 119 emits in both the forward and rear directions, providing optical input to photodetector assembly 105.

Throughout this disclosure, directional references to forward and rear refer to the direction of transmission of light with the forward direction being toward an optical fiber (i.e., ball lens 110 is at the front because it couples light into the optical fiber). Further, references to top and bottom (or up and down) are relative to laser 119 and heat sink 125, with heat sink 125 being on the bottom and laser 119 being on the top of optical assembly 100.

Figure 2A:
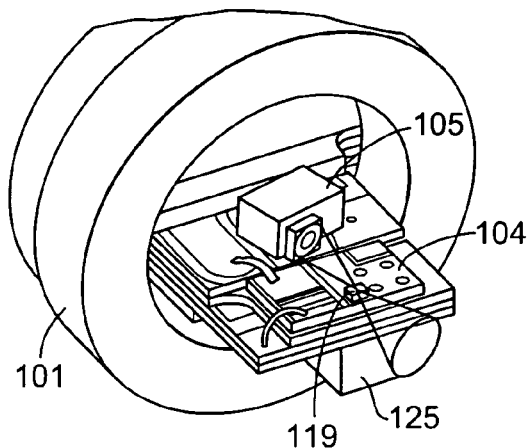
FIGS. 2A through 2D show mounting of laser diode and photodiode assemblies of an embodiment of an optical assembly according to the present invention.
Figure 2B:
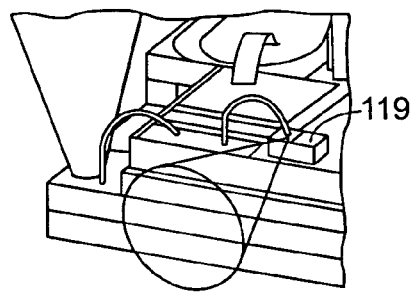
Figure 2C:
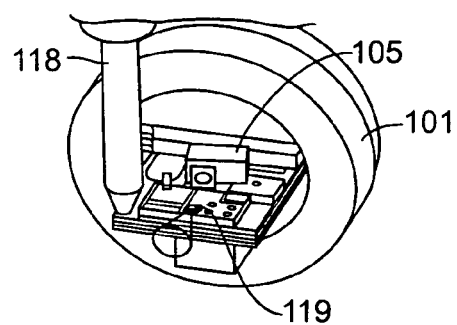
Figure 2D:
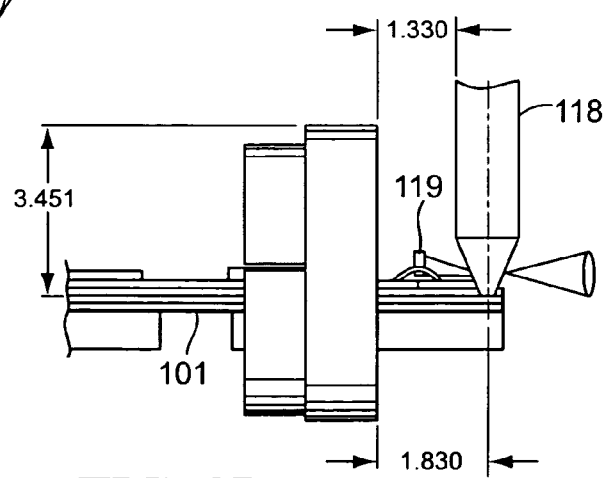

Electrical connections are made between photodetector assembly 105 and laser assembly 104 and the conductors mounted on feed-through assembly 101. FIG. 2D illustrates some clearance dimensions, in millimeters, for an embodiment of feed-through assembly 101 according to the present invention. In particular, clearances for a wire bond tool 118 with respect to parts of feed-through 101 are illustrated for a particular embodiment of the invention. In some embodiments, electrical connections between photodiode assembly 105, laser assembly 104 and the conductors of feed-through assembly 101 can be by gold wire-bond technologies, which are familiar to those skilled in the art.

Figure 3A:
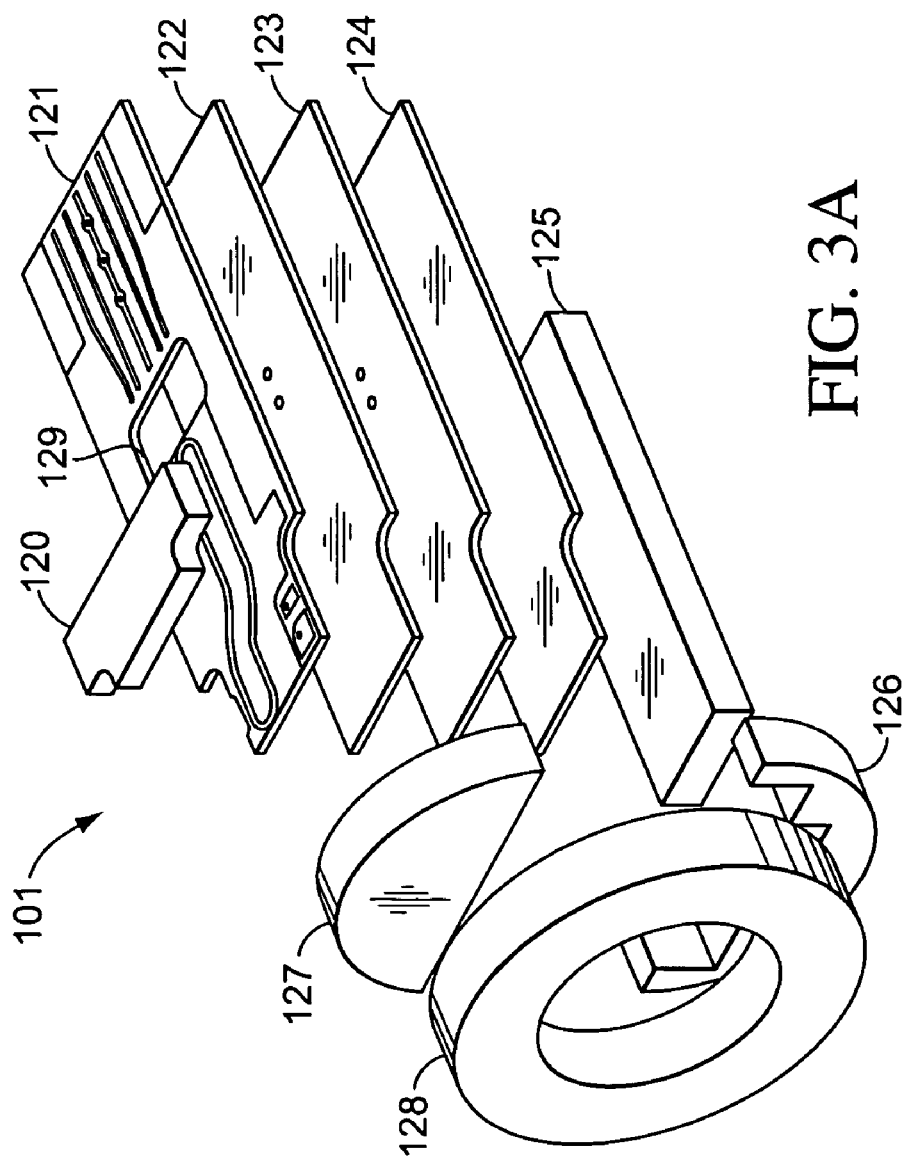
FIG. 3A shows an embodiment of a feed-through assembly of an optical assembly according to the present invention.

FIG. 3A illustrates some embodiments of feed-through assembly 101 according to the present invention. In the embodiment of feed-through assembly 101 shown in FIG. 3A, insulating ceramic layers 121, 122, 123, and 124 are bonded with a spacer 120 and heat sink 125. The combination is mounted within supports 127 and 126 and mounted to sealant ring 128. Insulating ceramic layers 121, 122, 123, and 124 provide electrical connections throughout feed-through assembly 101. Further, access 129 is provided in ceramic layer 121 to electrically and mechanically mount laser driver 106 to ceramic layer 122.

In some embodiments, ceramic layers 121, 122, 123, and 124 can be formed from a ceramic material with standard metallization utilized to form electrical conductors. In some embodiments, the characteristics of the metallization layers can be tailored to possess particular properties by controlling widths and material composition of the conducting traces. Resistor 109 can be formed directly on one of ceramic layers 121, 122, 123, or 124 or, alternatively, may be formed directly on laser assembly 104.

Figure 3B:
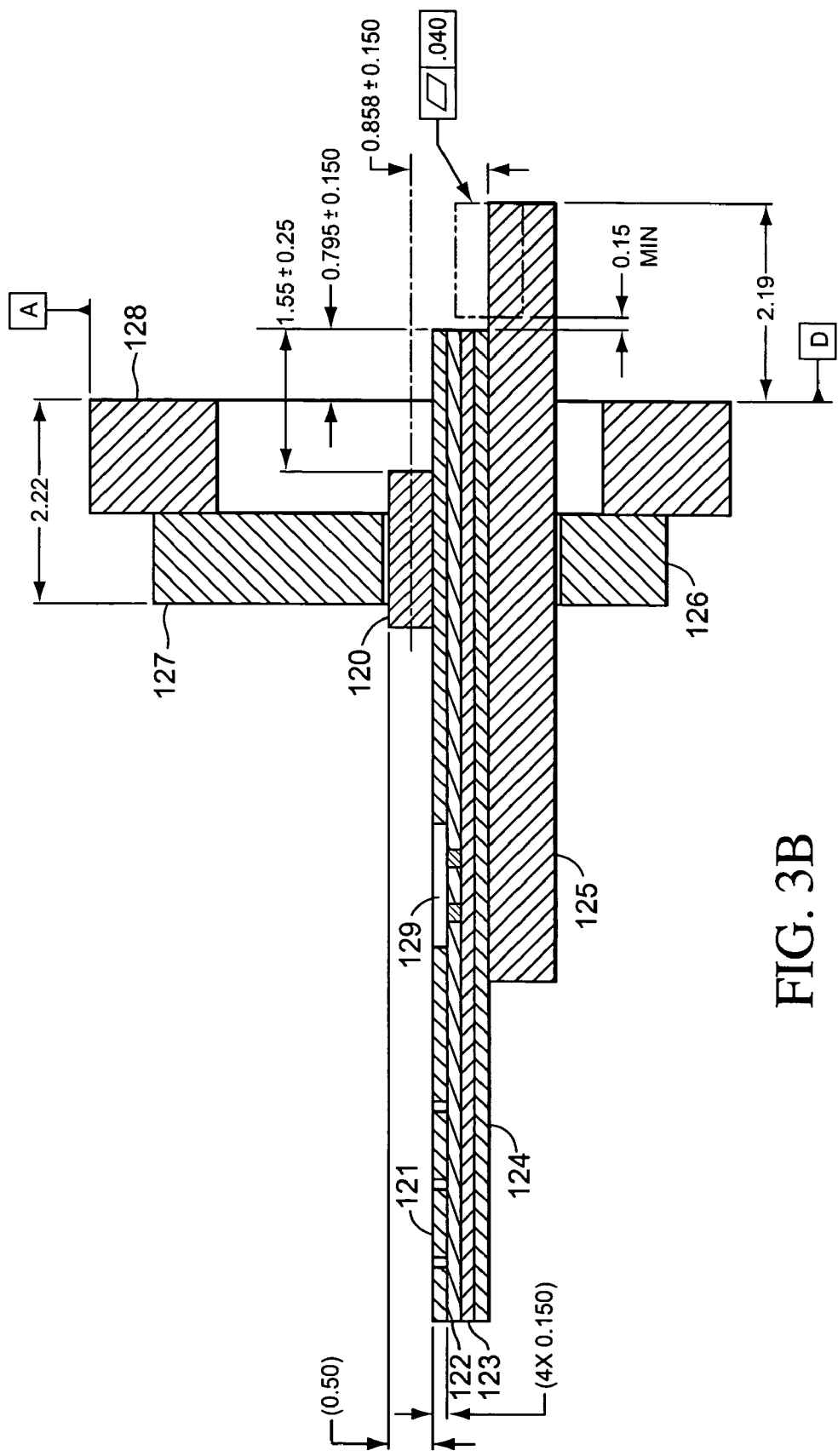
FIGS. 3B through 3R illustrate an embodiment of the feed-through shown in FIG. 3A.
Figure 3C:
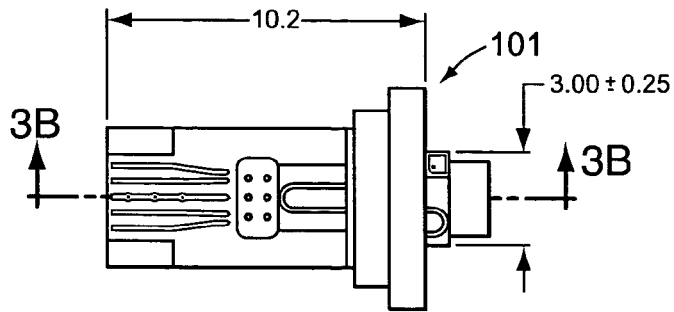
Figure 3F:
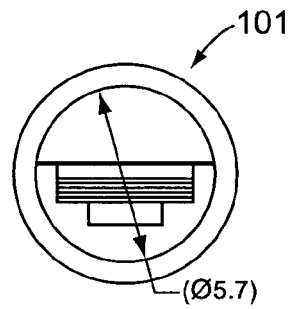
Figure 3D:
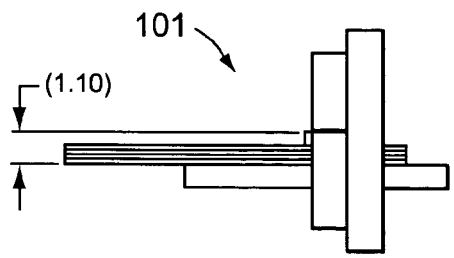
Figure 3G:
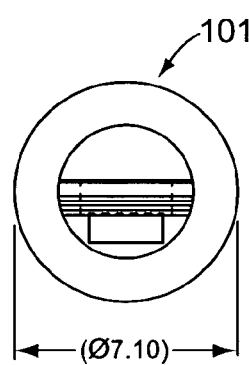
Figure 3E:
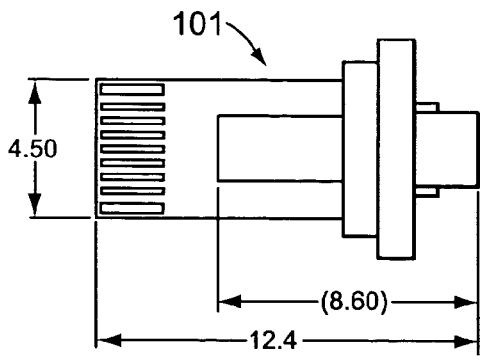
Figure 3H:
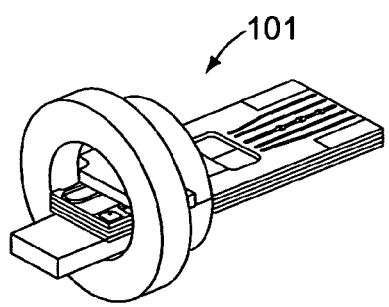
Figure 3I:
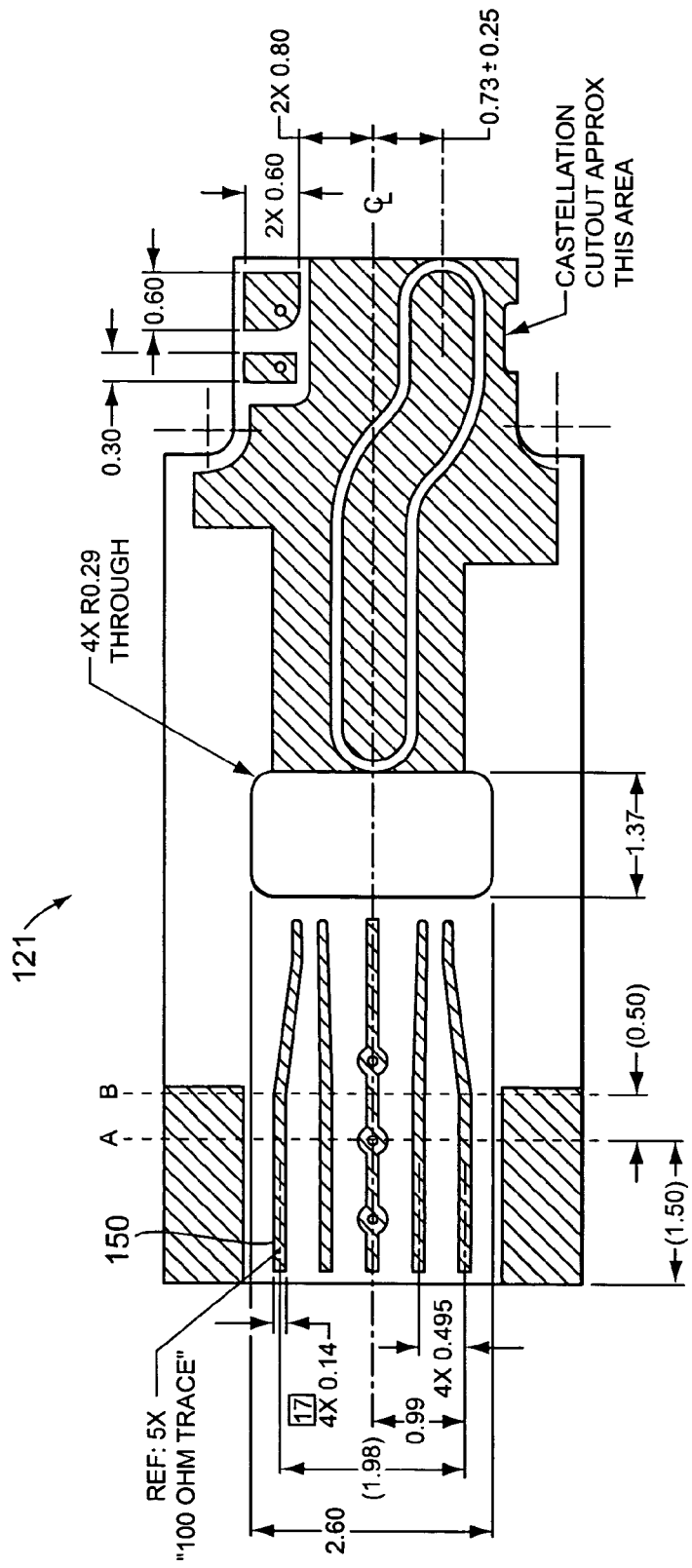

FIG. 3I shows an embodiment of ceramic layer 121 with metallization 150. In the embodiment shown in FIG. 3I, for example, each of the traces of metallization 150 can be 100 Ohm traces. In particular, traces to the left of the line marked A can be formed by a first layer of tin-lead solder, for example about 0.013 millimeters thick, with a second layer of copper about 0.025 millimeters thick deposited over the first layer. A third layer of a substrate film is formed over the second layer. In some embodiments, the substrate film is a polymide film, for example about an 0.025 millimeter thick layer of Kapton produced by Dow Chemical, is formed.

Finally, a fourth layer of copper plating is added. This layering provides electrical connections to feed-through 101 directly. Between the lines marked A and B, however, a different layering of 100 Ohm traces can be utilized. Between lines A and B, a first layer of tin-lead solder having a thickness of about 0.013 millimeter can be added and a second layer of copper trace of about 0.025 mm thickness can be added over the first layer. Finally, a top layer of substrate film, for example about 0.025 mm of Kapton, can be added. To the right of the line marked B, a layer of substrate material, for example a 0.025 mm layer of Kapton, can be utilized in the formation of traces of metallization 150.

As is apparent, the metallization utilized on feed-through 101 must withstand the rigors of attachment to supports 126 and 127, and sealing ring 128. In some embodiments, supports 126 and 127 are hermetically sealed to spacer 120, insulating plates 121 through 124, and heat sink 125 by, for example, a gold-copper braze. In some embodiments, the hermetic seal provides a He leak rate of less than about $1 \times 10^{-8}$ atm-cc/sec. In formation of a hermetic seal between supports 126 and 127 and spacer 120, insulating plates 121 through 124, and heat sink 125, solder material, braze material, or glass may be used.

Figure 3J:
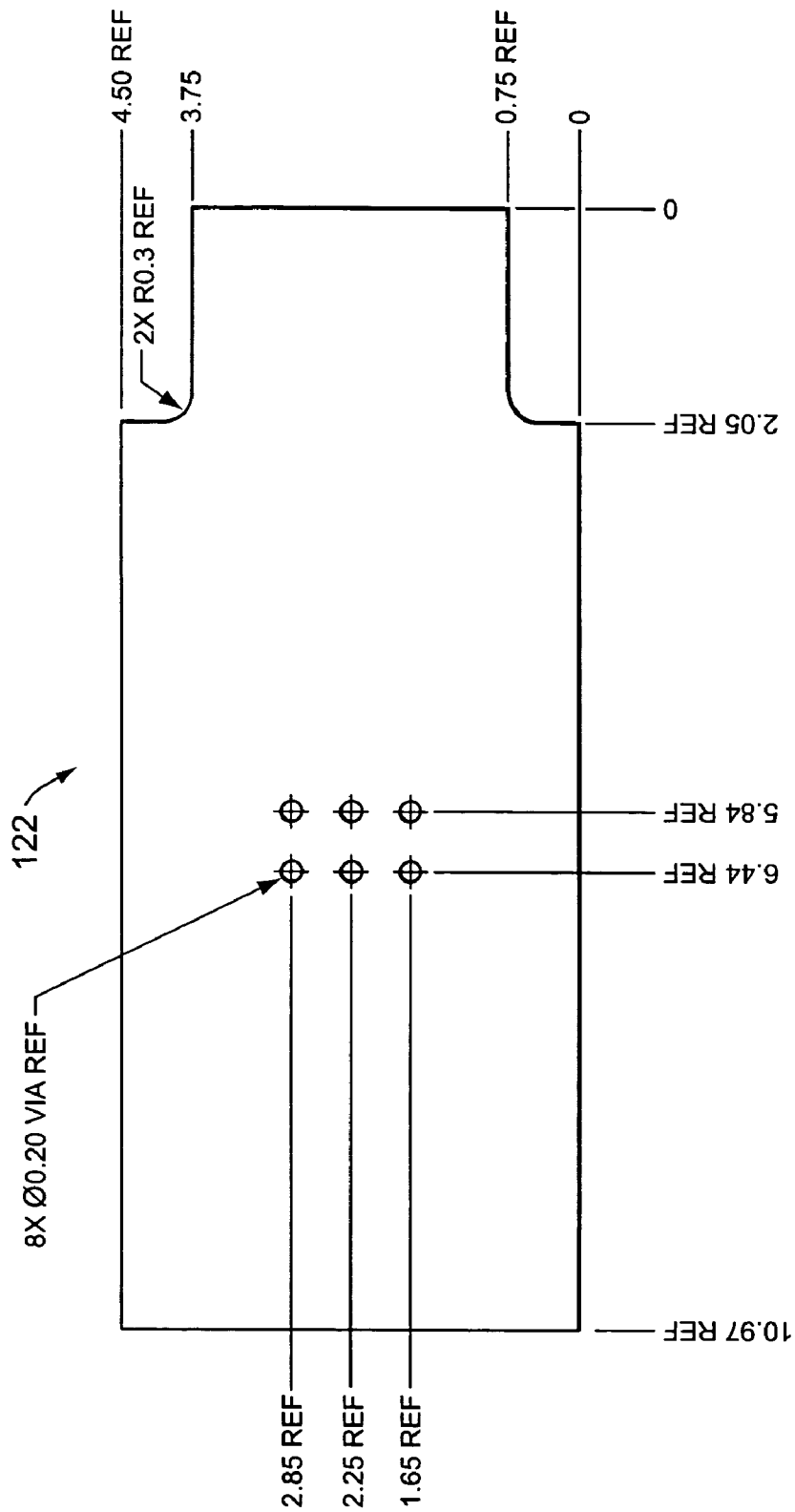
Figure 3K:
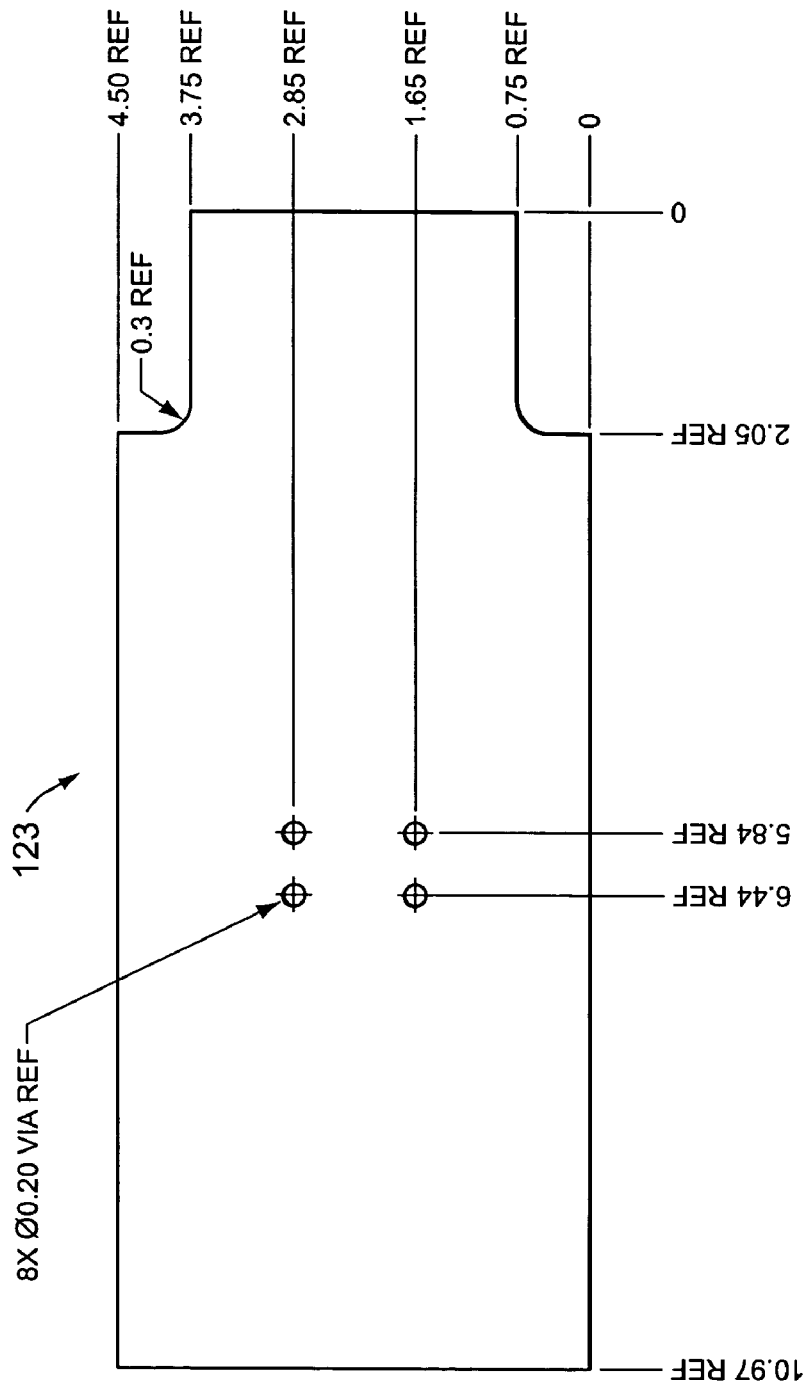
Figure 3L:
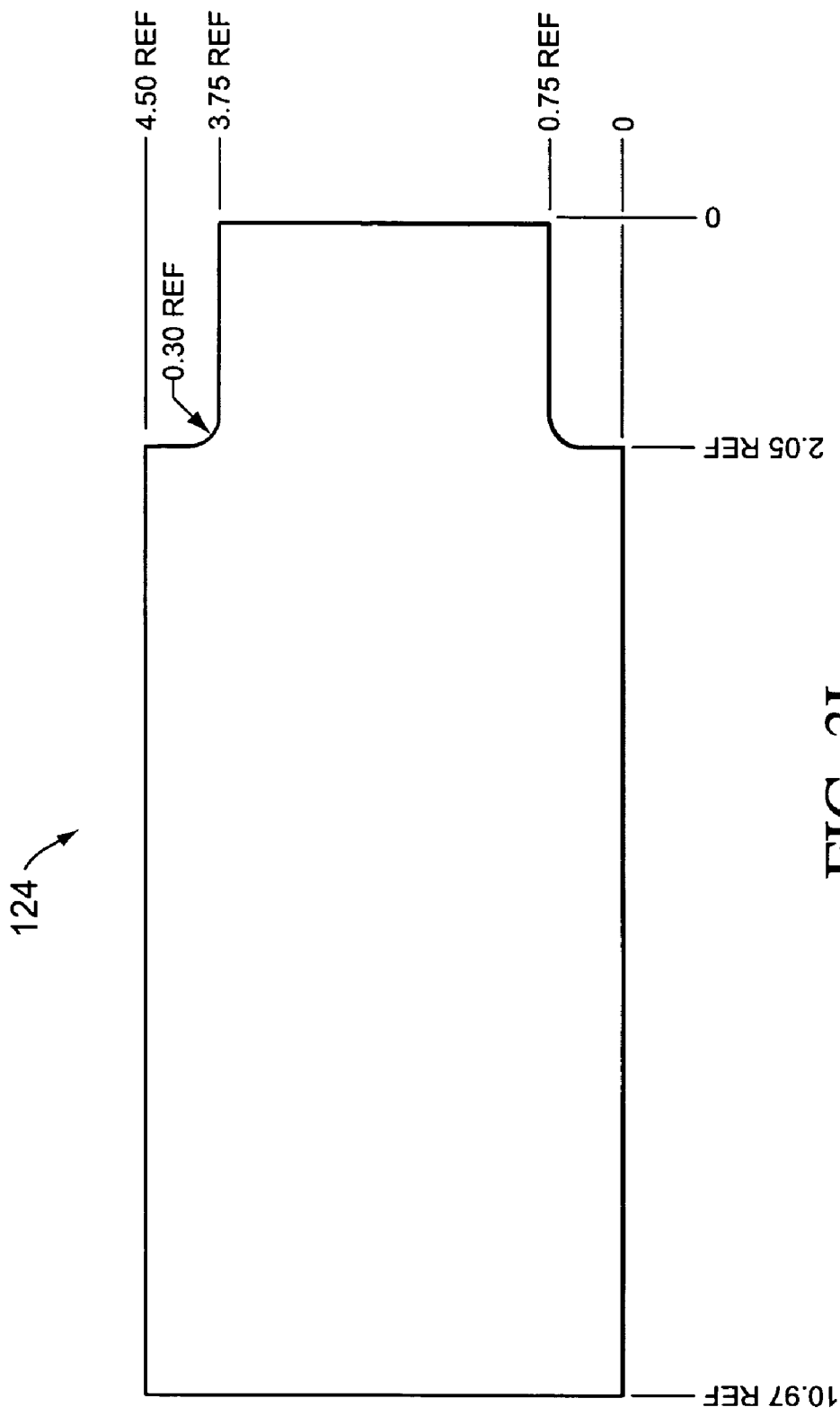
Figure 3M:
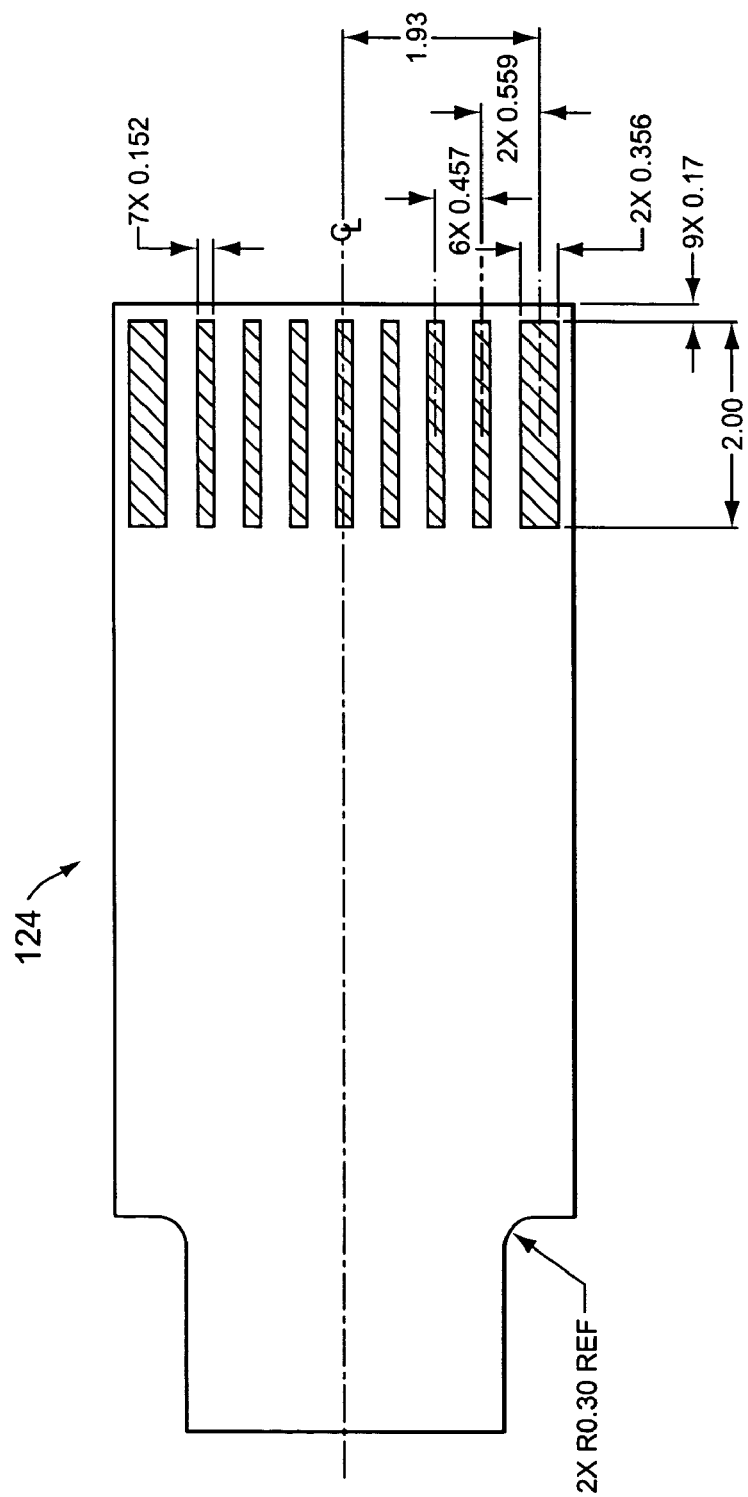
Figure 3N:
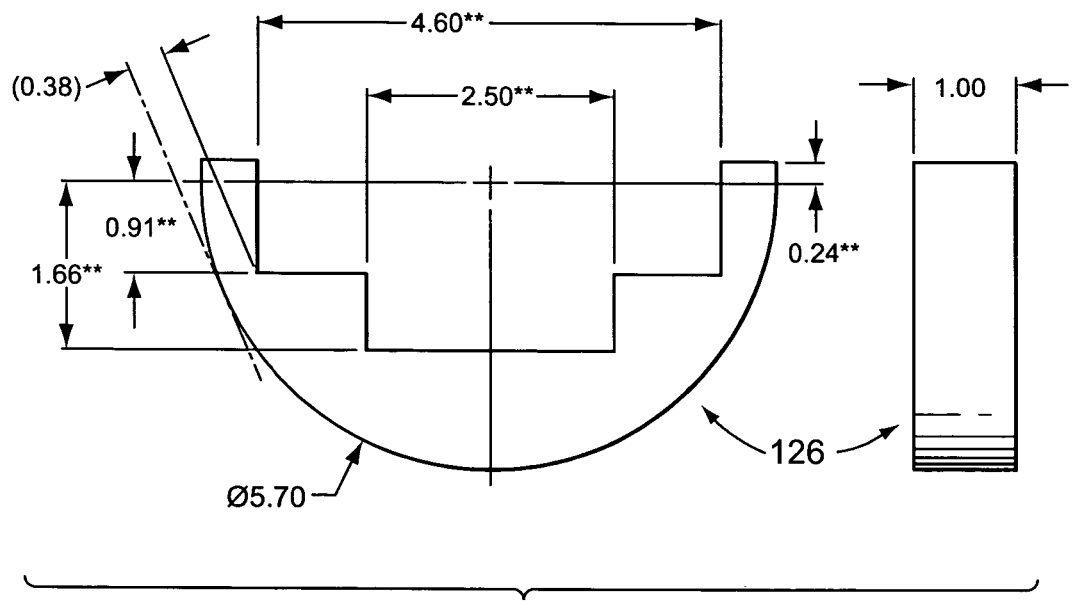
Figure 3O:
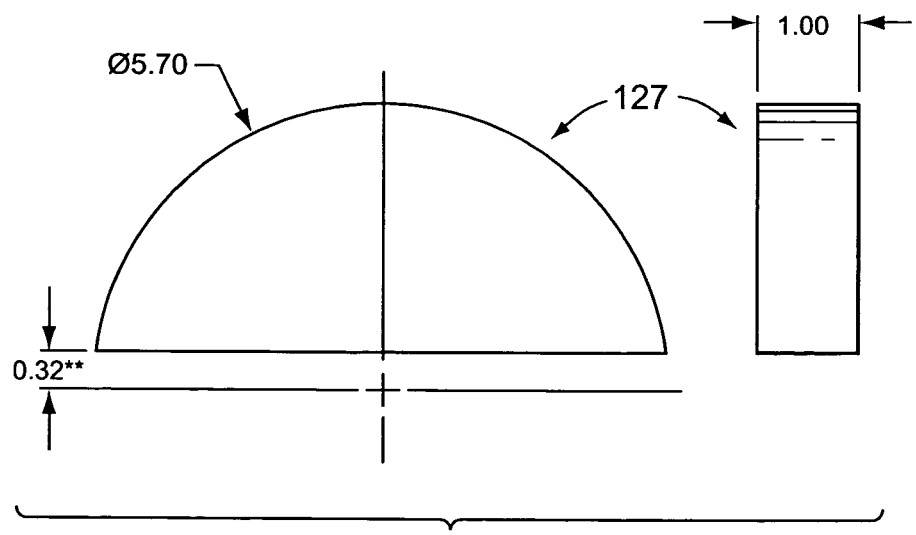
Figure 3P:
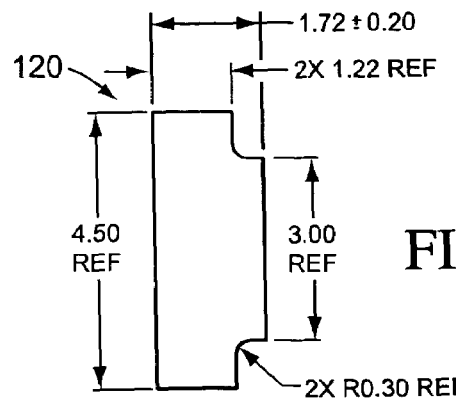
Figure 3Q:
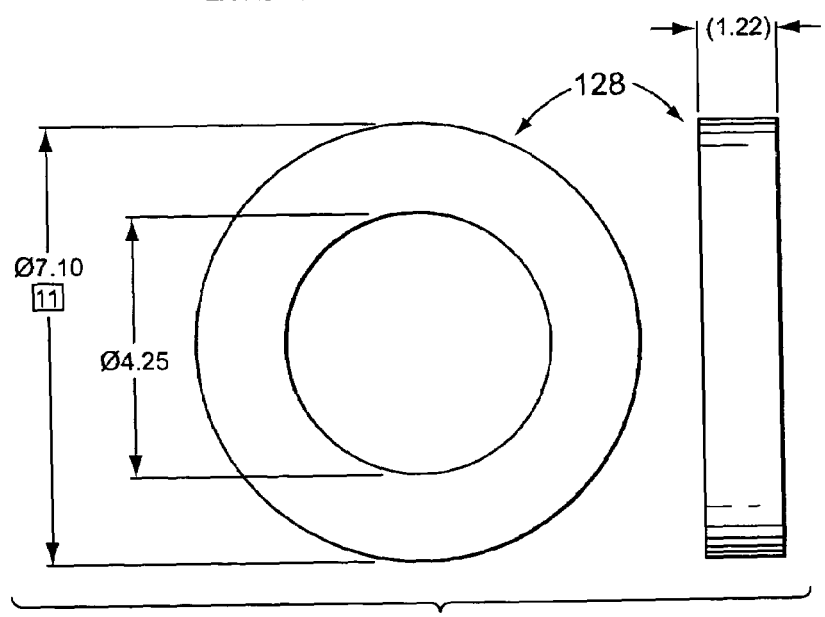
Figure 3R:
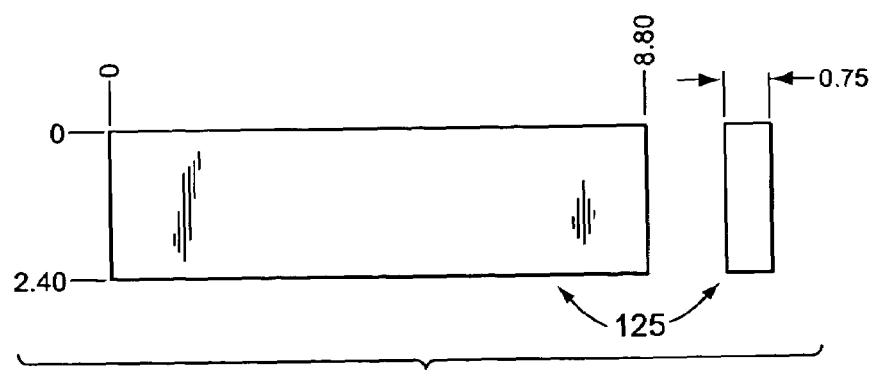

FIG. 3B shows a cross-sectional view of the embodiment of feed-through 101 shown in FIG. 3A after assembly. The dimensions and tolerances shown in FIGS. 3B through 3R are in millimeters and apply to one particular example embodiment of the invention and are not generally limiting. FIGS. 3C through 3H show various views of an assembled embodiment of feed-through 101 shown in FIG. 3B. FIG. 3I illustrates the dimensions and metallization of a particular embodiment of insulating layer 121 shown in FIG. 3B. FIG. 3J shows the dimensions of a particular embodiment of insulating layer 122 shown in FIG. 3B. FIG. 3K shows a particular embodiment of insulating layer 123 of the embodiment of feed-through 101 shown in FIG. 3B. FIG. 3L shows the dimensions of a particular embodiment of insulating layer 124 of the embodiment of feed-through 101 shown in FIG. 3B. FIG. 3M shows the dimensions of the bottom side of insulating layer 124 of the embodiment of feed-through 101 shown in FIG. 3B, and in particular shows metallization to provide external electrical connections for the embodiment of feed-through 101 shown in FIG. 3M. FIG. 3N shows the dimensions of a particular embodiment of support 126 of the embodiment of feed-through 101 shown in FIG. 3B. FIG. 3O shows the dimensions of support 127 for the particular embodiment of feed-through 101 shown in FIG. 3B. FIG. 3P shows dimensions for spacer 120 for the particular embodiment of feed-through 101 shown in FIG. 3B. FIG. 3Q shows dimensions for sealing ring 128 for the particular embodiment of feed-through 101 shown in FIG. 3B. FIG. 3R shows the dimensions for heat sink 125 for the particular embodiment of feed-through 101 shown in FIG. 3B.

Figure 4A:
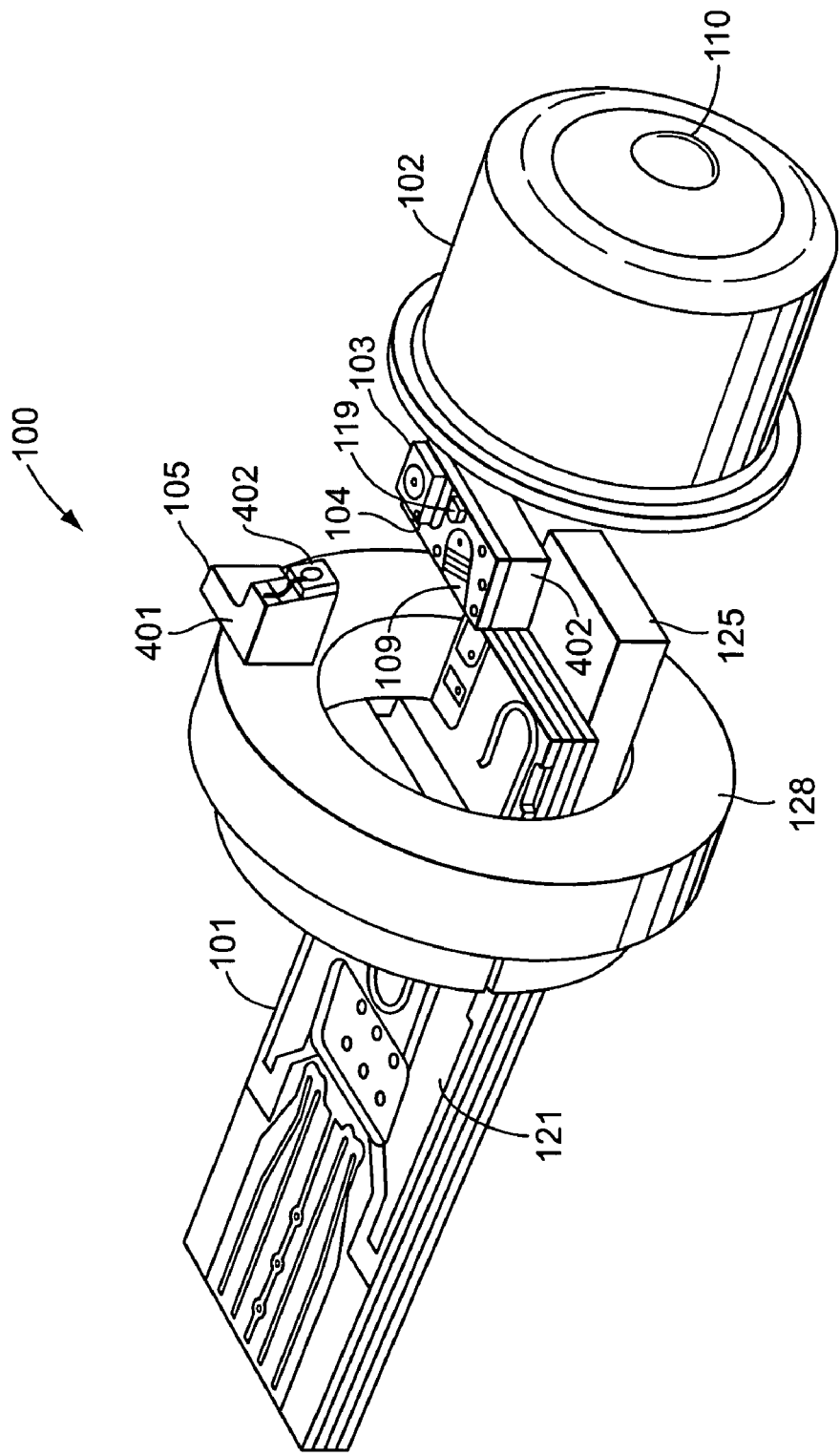

FIG. 4A illustrates assembly of an embodiment of optical assembly 100 according to the present invention. Photodiode assembly 105 and laser assembly 104 are constructed and mounted on feed-through assembly 101. Cap 102, with ball lens 110, are then mounted to sealant ring 128. As shown in the embodiment of optical assembly 100 shown in FIG. 4A, lens assembly 104 can be mounted directly onto heat sink 125 of feed-through assembly 101. Photodiode assembly 105 can be mounted on insulating board 121 of feed-through assembly 101.

Photodiode assembly 105 includes photodiode submount 401 and photodiode 402 mounted on photodiode submount 401. Submount 401 provides structure for photodiode 402 and electrical contacts to electrically couple photodiode 402 with conducting traces on feed-through assembly 101. Photodiode 402 can be any device that produces an electrical signal in response to an optical signal. FIGS. 5A through 5E illustrate a particular embodiment of submount 401. Submount 401 is an "L-shaped" mount that is formed from an insulating material appropriate for holding photodiode 402. Submount 401, for example, can be formed of alumina, alumina nitrate, or other suitable material. Metallization of conducting leads 501 can be formed on submount 401 in order to electrically couple photodiode 402, when mounted on submount 401, to conducting traces in feed-through assembly 101. Conducting leads 501 should be capable of withstanding the conditions of mounting photodiode assembly 105 onto feed-through assembly 101. In some embodiments, conducting leads 501 can be formed from electroless Ni and electroless Au about 1.5 micron thick.

Figure 5A:
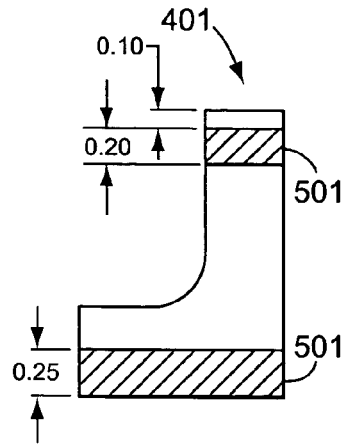
FIGS. 5A through 5E illustrate assembly of a particular embodiment of a photodiode assembly compatible with the particular embodiment of feed-through assemblies shown in FIGS. 3B through 3O.
Figure 5B:
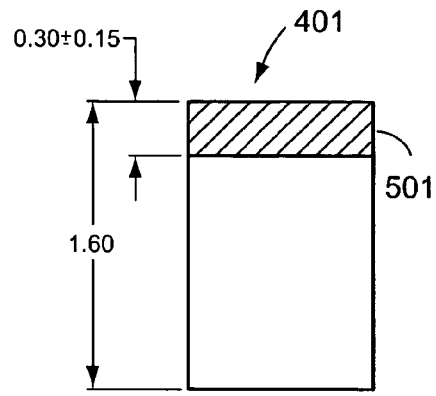
Figure 5C:
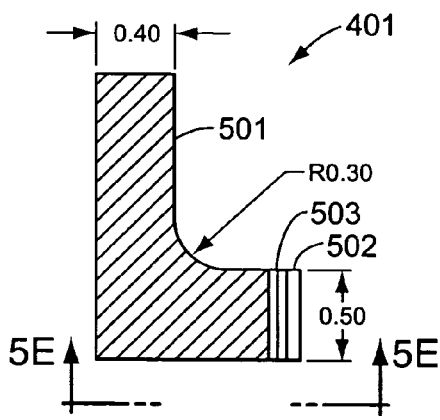
Figure 5D:
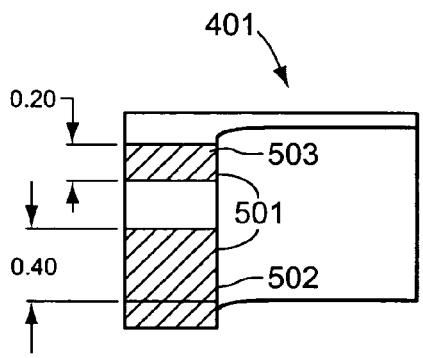
Figure 5E:
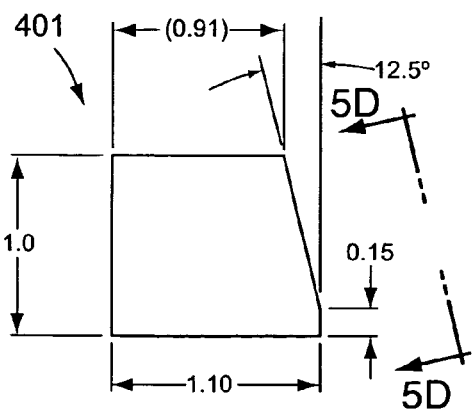

FIG. 5A shows a planar view of a particular embodiment of a first surface of submount 401 with conducting leads 501. FIG. 5B shows a planar view of a particular embodiment of a second surface oriented perpendicularly to the first surface of submount 401. FIG. 5C shows a planar view of a third surface oriented opposite the first surface of submount 401. FIG. 5E shows a view of submount 401 along the directions indicated by the notation 5E—5E in FIG. 5C. FIG. 5D shows a view of submount 401 rotated 12.5° clockwise from the view indicated by the designation 5D—5D in FIG. 5E.

Photodiode 402, as shown in FIG. 4A, can be mounted to a conducting surface such as surface 502 as shown in FIG. 5D. A second electrical connection can be made to conducting surface 503 of FIG. 5D by wire bonding. Electrical contact, then, can be made between photodiode 402 and electrical traces on submount 401.

As shown in FIG. 4A, laser assembly 104 includes laser subassembly 404. Laser 119 is mounted onto laser subassembly 404. In the embodiment shown in FIG. 4A, inductor 103 is also mounted on laser assembly 104. In some embodiments, laser 119 can be an InGaAsP 1310 nm DFB laser, which can be purchased as model ML792H28 from Mitsubishi Electric. Inductor 103 can be purchased from US Microwave as an L10 62nH-20Q case 30×30 inductor.

FIGS. 6A through 6F illustrate formation of an embodiment of laser submount assembly 404 according to the present invention. Although a particular embodiment is described in FIGS. 6A through 6F, one skilled in the art will recognize that the present invention is not limited to this embodiment.

Figure 6A:
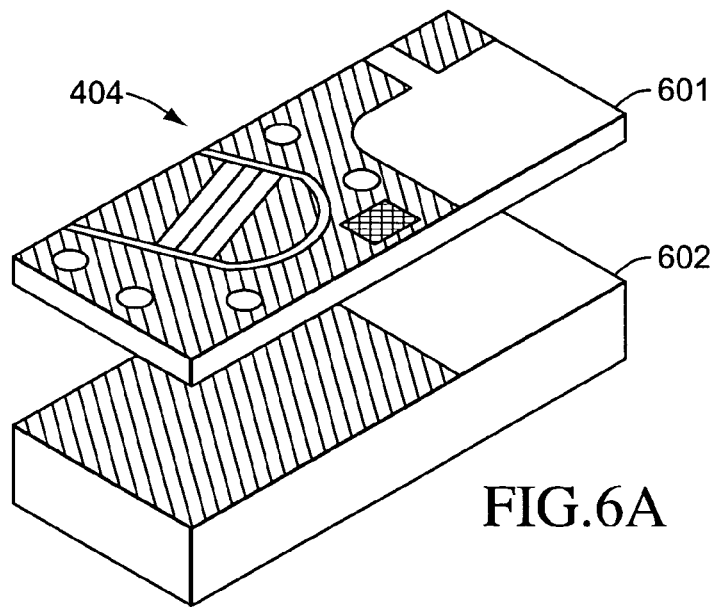
FIGS. 6A through 6F illustrate assembly of a particular embodiment of a laser assembly compatible with the particular embodiment of feed-through assembly shown in FIGS. 3B through 3O.

FIG. 6A shows an embodiment of laser assembly submount 404. Submount 404 includes a top portion 601 and a bottom portion 602. Both top portion 601 and bottom portion 602 can be formed from aluminum nitride, for example material AN271 purchased from Kyocera. Other manufacturers, including Dupont, Alfa, and Tokuyama, produce similar materials. Conducting traces can be deposited onto top portion 601 and bottom portion 602 to provide both electrical connections and thermal transport paths.

Figure 6B:
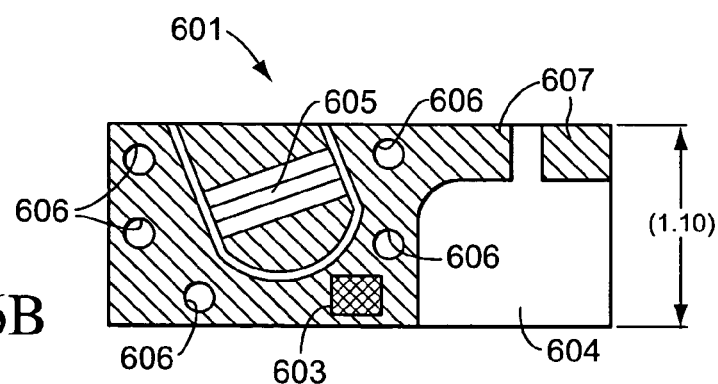

FIG. 6B shows a top surface of top portion 601, with metallization. Top portion 601 also includes vias 606 which, when filled with a conducting material, provide electrical and thermal connections through top portion 601. Further, a thin film resistor can be deposited in resistor region 605. Resistor 109 of FIG. 1C, then, can be deposited in region 605. In some embodiments, thin film resistor 109 deposited in region 605 can be rated for about 12 Ohm+/−2% at about 250 mW of power and can be formed from aluminum. Thatched areas 607 can be plated with a conductor which can act as a thermal conductor. Thatched areas 607, then, are electrically isolated from region 605 and 604. The plating in area 607 can, for example, be formed by about 0.1 micron of titanium, about 0.2 micron of lead, and about 1.5 micron of gold. The plating can be tested and should not be damaged (e.g., no peeling or discoloration) after, for example, a timed bake (e.g., about 3 minutes at about 400° C.).

Region 603 provides a mount for laser 119. Region 603 may be electrically coupled to the plating in region 607, which would provide an electrical ground for laser 119. Region 603 includes further metallization in order to mount and provide electrical and thermal contact with laser 119. In some embodiments, the plating as shown in region 607 is further covered with about 0.5 micron of platinum and about 4.0 micron of gold-tin solder. In some embodiments, the gold-tin solder should be about 76%+/−2% gold by weight.

Region 604 provides an area on which to mount spiral inductor 103. Spiral inductor 103 can be mounted, for example, with a non-conductive epoxy material.

Figure 6C:
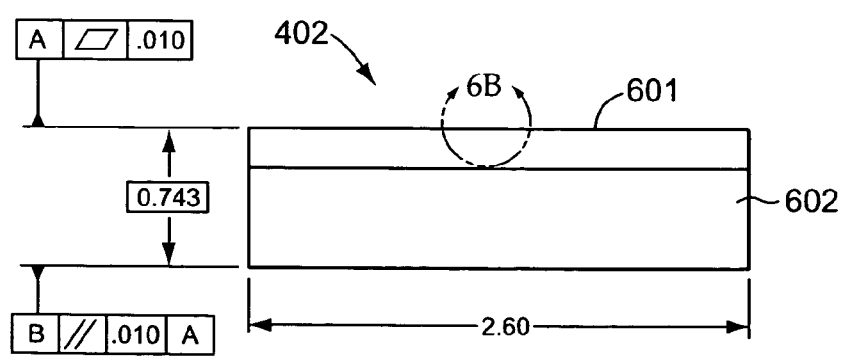
Figure 6D:
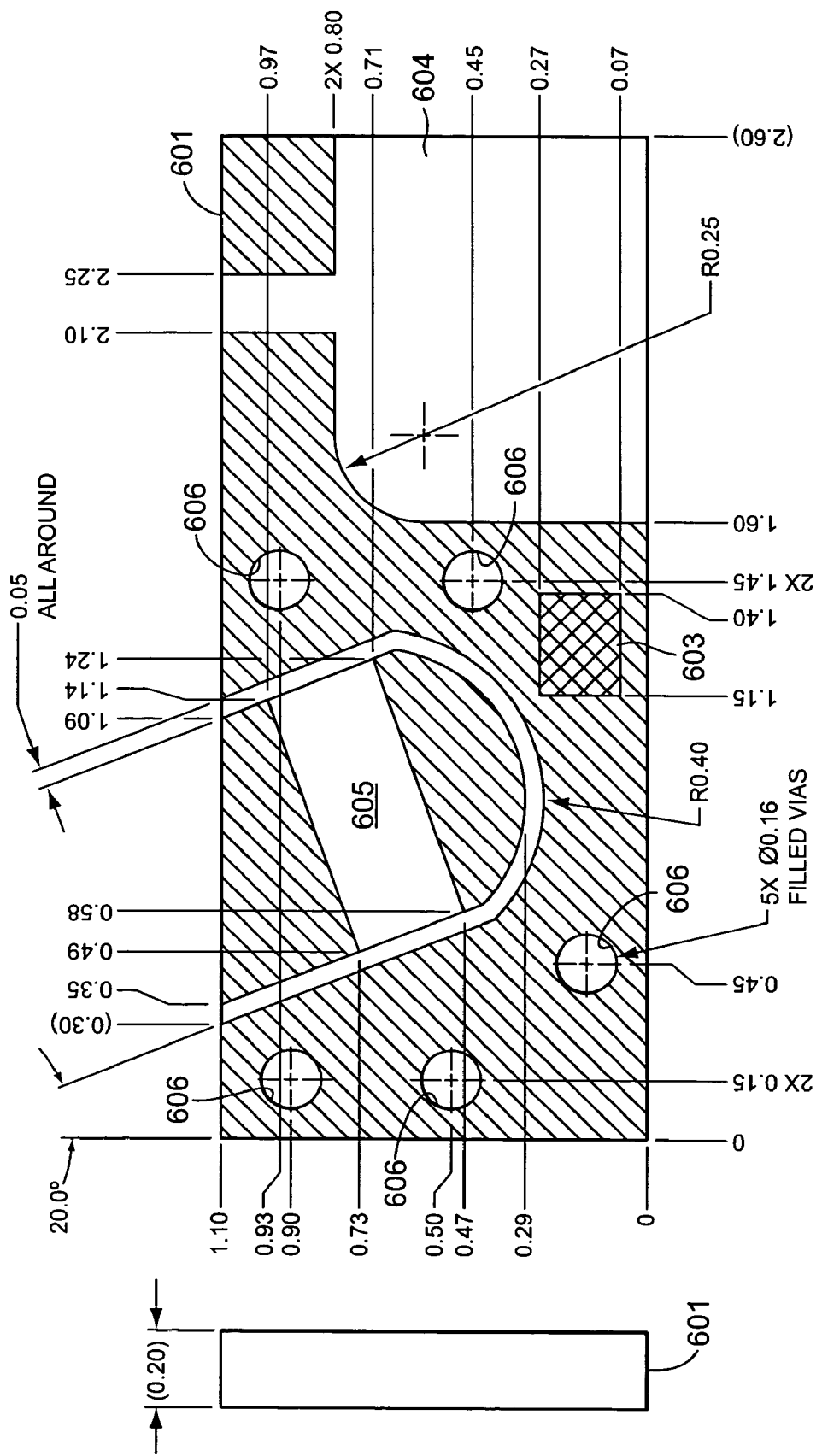

FIG. 6C shows top portion 601 mounted to bottom portion 602 for a particular embodiment of laser submount assembly 402 according to the present invention. FIG. 6D shows dimensions of metallization features for a particular embodiment of top portion 601 of laser submount assembly 402. In the particular embodiment of top portion 601 shown in FIG. 6D, the thickness of top portion 601 shown is prior to metallization. Further, the dimensions of resistor area 605 is a maximum area for the printed resistor.

Figure 6E:
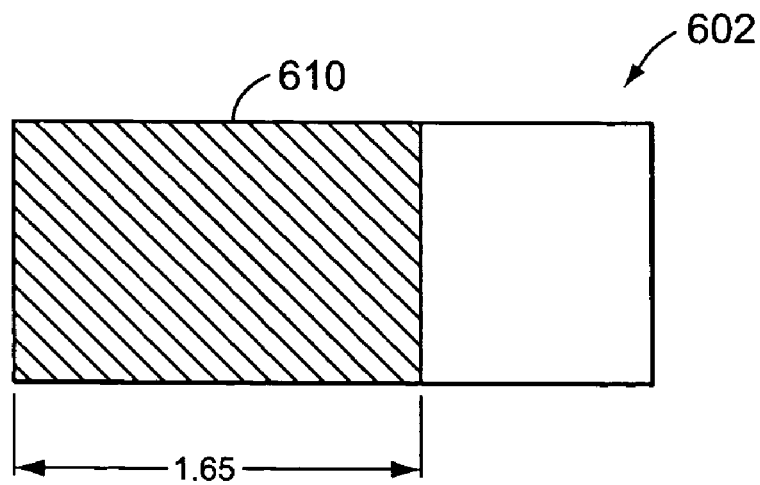
Figure 6F:
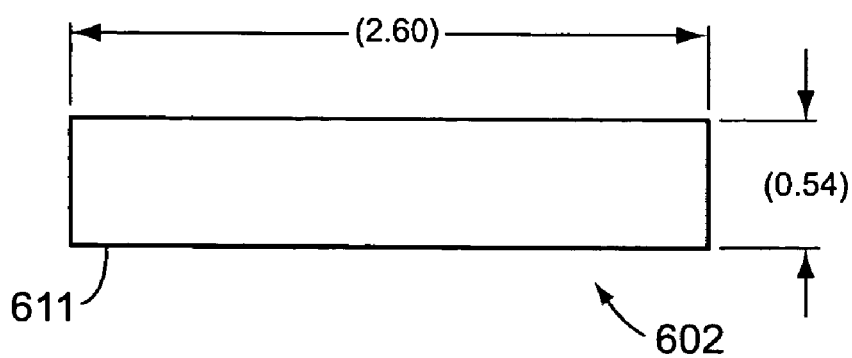

FIGS. 6E and 6F illustrate an embodiment of bottom portion 602 of laser submount assembly 402. As shown in FIG. 6E, a portion of the top surface of bottom portion 602 is partially plated in region 610 with conducting material. In some embodiments, for example, about 0.1 microns of titanium is deposited on the top surface of bottom portion 602, about 0.2 microns of lead is deposited over the titanium, and about 1.5 microns of gold is deposited over the lead. Other metallizations can, of course, be utilized as well. In some embodiments, other conductors such as copper, silver, or aluminum may be utilized to form the metallizations. As before, the metallization should withstand further processing and may be tested, for example, by a timed bake (e.g., about 3 minutes at about 400° C. to check for peeling, blistering or discoloration). As shown in FIG. 6F, the entire bottom surface of bottom portion 602 can also be metallized to allow coupling of laser submount 404 with heat sink 125 of feed-through assembly 101. The bottom surface 611 of bottom portion 602 may, for example, be coated with a gold-tin solder. In some embodiments, the gold-tin solder can be about 76%+/−2% gold by weight.

When top portion 601 is coupled with bottom portion 602, vias 606 provide electrical and thermal connections between region 607 of top portion 601 and region 610 of bottom portion 602. Therefore, heat from laser 603 is conducted through region 610 and bottom portion 602 to heat sink 125. Further, heat from resistor region 605 can be conducted through the material of top portion 601 to conducting portion 610 and finally to heat sink 125.

Although particular dimensions are illustrated in FIGS. 6A through 6F, those dimensions are included to describe a particular example embodiment of laser submount assembly 402. The present invention is not limited to these dimensions. The particular dimensions shown in FIGS. 6A through 6F are, unless otherwise stated, in units of millimeters.

FIG. 4B shows a planar view of an embodiment of the assembled optical assembly 100 shown in FIG. 4A. FIG. 4C shows a view of the assembled optical assembly 100 shown in FIG. 4A along the line designated as 4E—4E as shown in FIG. 4B. FIG. 4D illustrates the view along the line desianated 4G—4G of the embodiment of the assembled optical assembly 100 shown in FIGS. 4B and 4C.

Figure 4E:
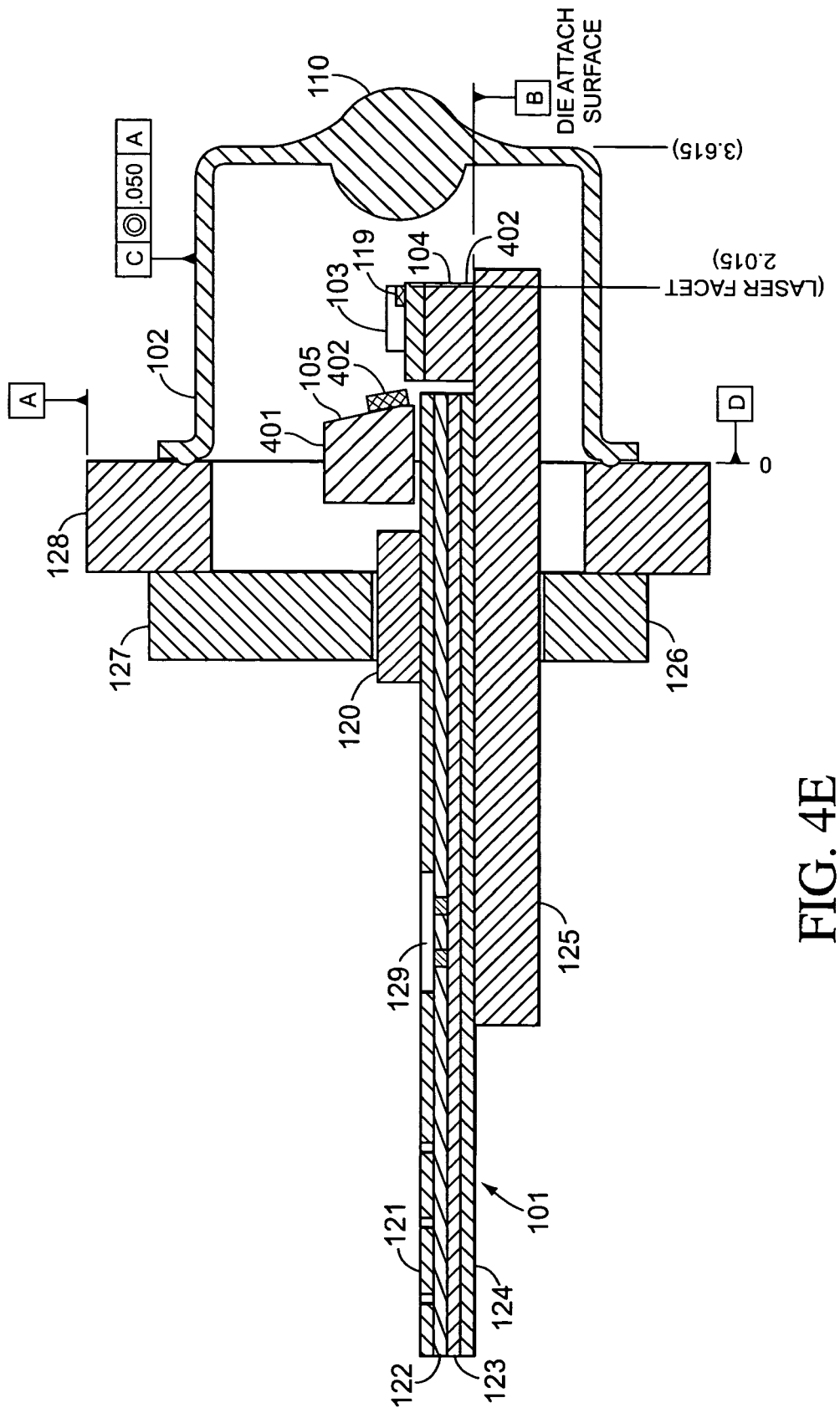

FIG. 4E is a schematic diagram along the line designated as 4E—4E shown in FIG. 4B of an embodiment of optical assembly 100 shown in FIG. 4A. Fully assembled, optical assembly 100 includes feed-through assembly 101, photodiode assembly 105 mounted on feed-through assembly 101, laser assembly 104 mounted on heat sink 125 of feed-through assembly 101, and cap 102 with ball lens 110 mounted on feed-through assembly 101. Feed-through assembly 101, in some embodiments, includes printed insulating ceramic layers 121, 122, 123, and 124 coupled together. One skilled in the art will recognize a number of metallization geometries which allow electrical connections to photodiode assembly 105 and laser assembly 104 along with a laser driver 106 (see FIG. 1A), which can be mounted in access 129 of printed ceramic layer 121. Feed-through assembly 101 also includes heat sink 125. In the embodiment shown in FIG. 2E, laser assembly 104 is mounted directly on heat sink 125. In other embodiments, other arrangements may be made to thermally couple laser assembly 109 with heat sink 125. Further, laser driver 129 can be mounted on ceramic layer 122 and, through ceramic layers 122, 123, and 124, is also thermally coupled to heat sink 125. Better thermal stabilization of optical assembly 101, then, can be achieved by this arrangement. Feed-through assembly 101 also includes spacer 120 and supports 126 and 127, which are mechanically coupled to form a hermetic seal around ceramic layers 121, 122, 123, and 124 and heat sink 125. An embodiment of photodiode assembly 105 is illustrated in FIGS. 5A through 5E and discussed above. An embodiment of laser assembly 104 is illustrated in FIGS. 6A through 6F and discussed above.

As illustrated in FIG. 4E, laser 119, which is part of laser assembly 104, provides an output optical beam directed in the forward direction through ball lens 110. The optical beam from laser assembly 104 can then be coupled to an optical fiber as illustrated in FIG. 1B. Laser 119 also generates optical radiation directed in the backward direction towards photodiode 402 of photodiode assembly 105. Photodiode 402 can provide feedback to laser driver 106 mounted in access 129 in order to monitor the output power of laser 119.

Figure 4F:
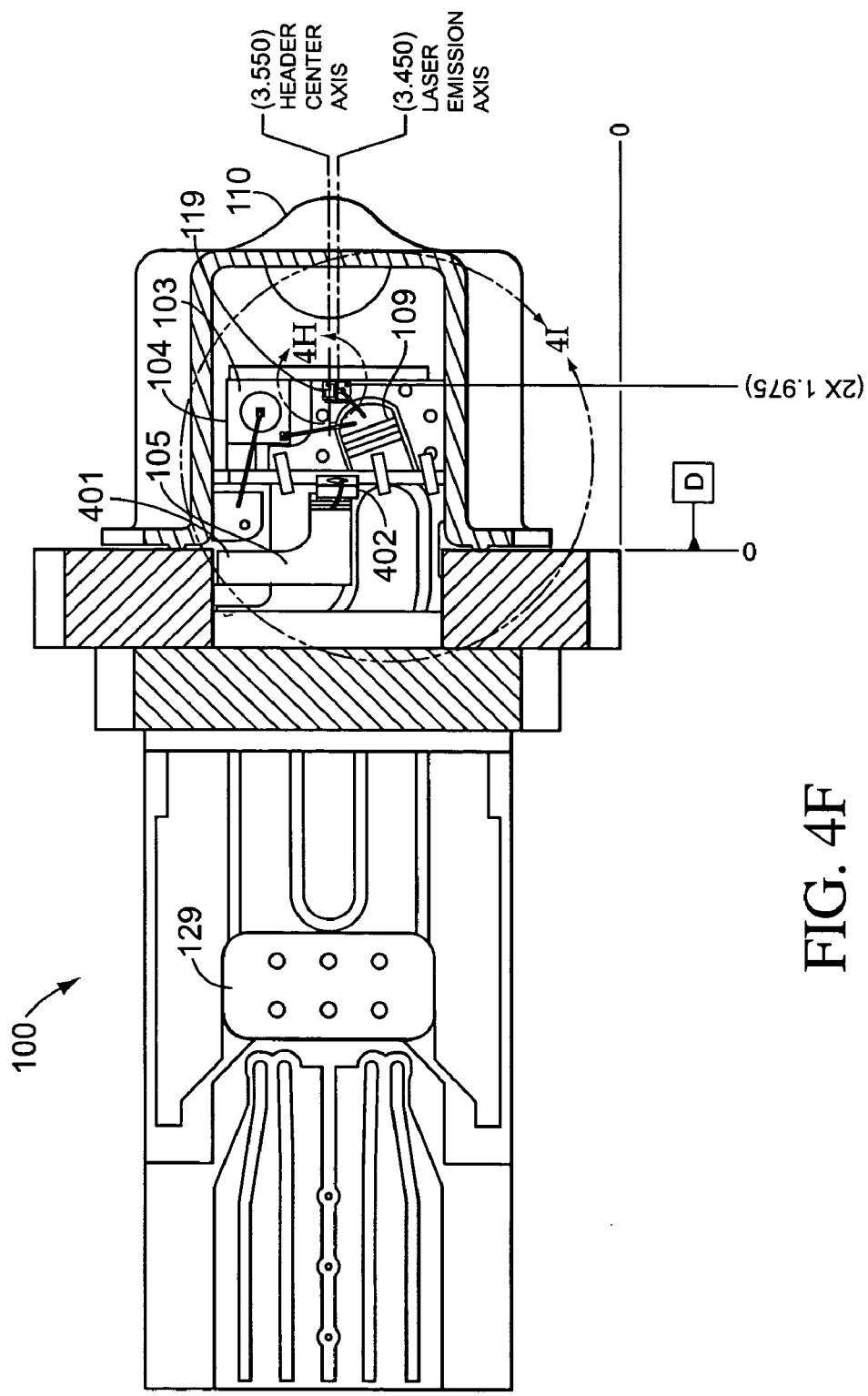
Figure 4G:
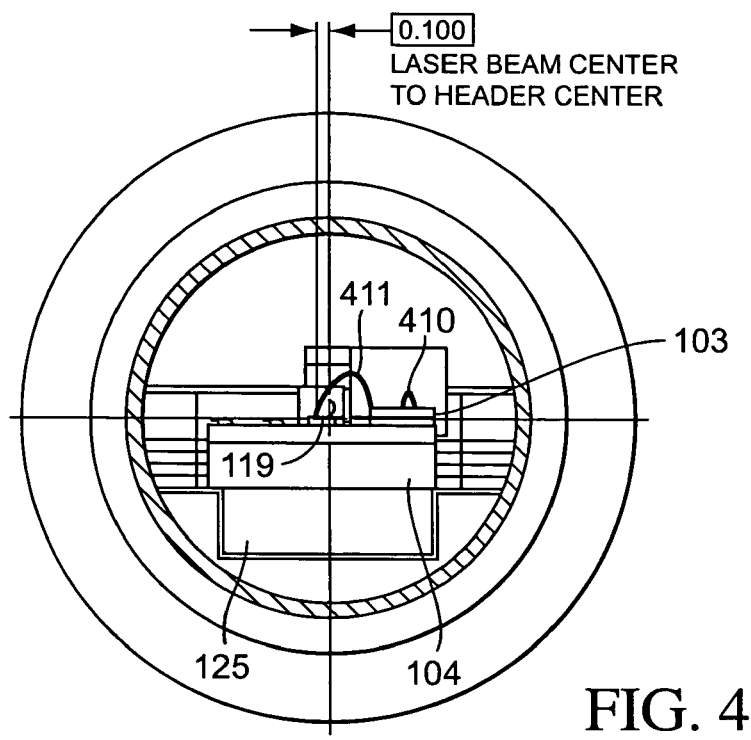
Figure 4H:
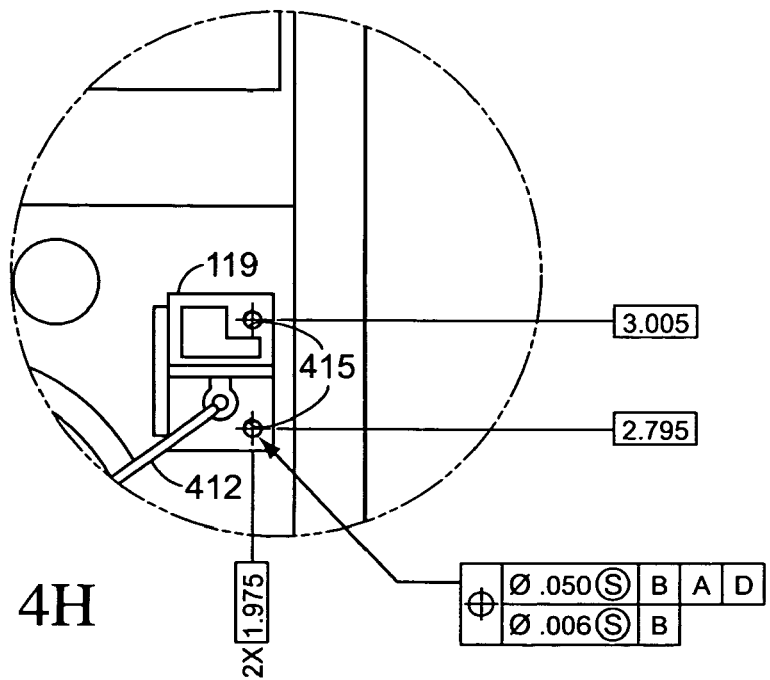
Figure 4I:
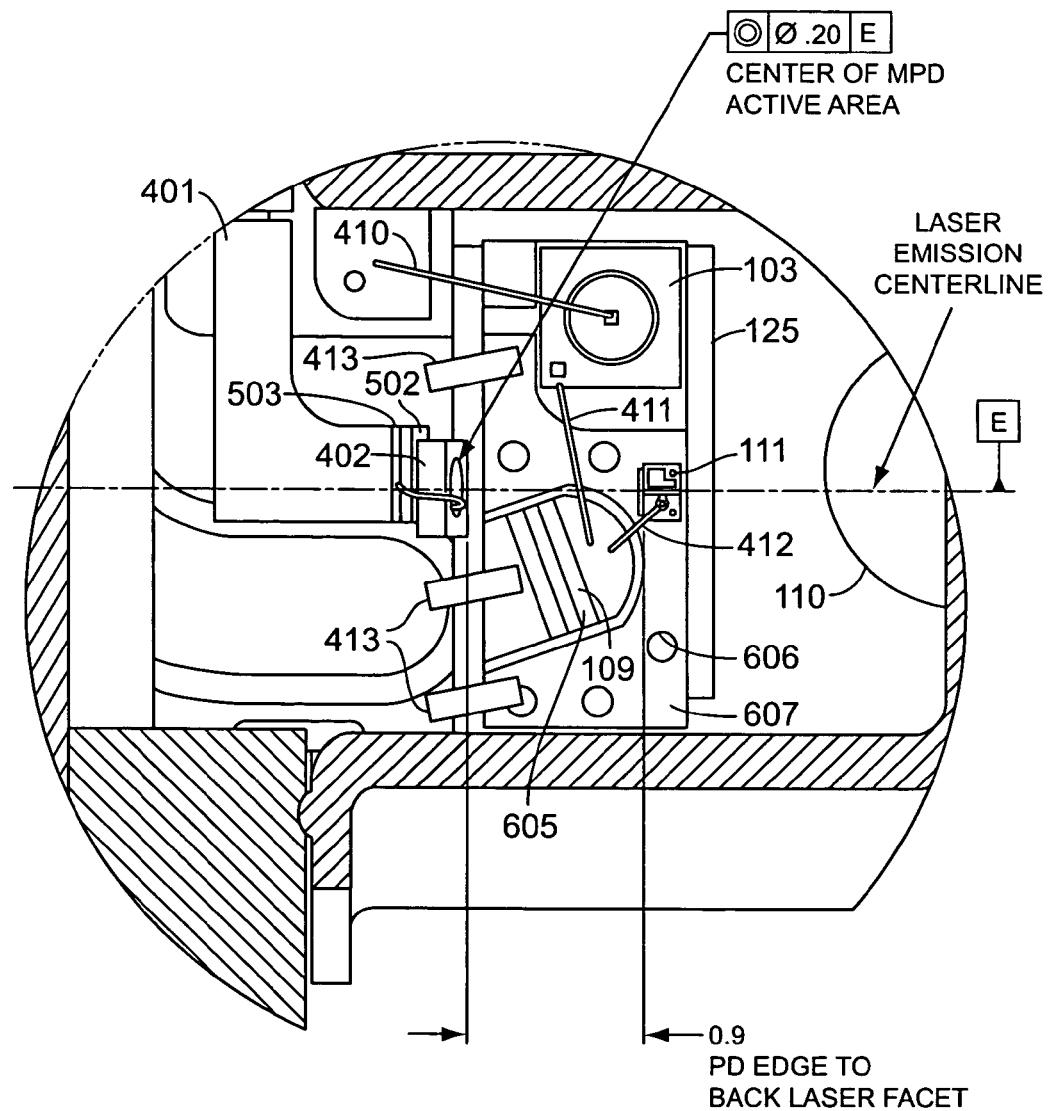

FIGS. 4F and 4I illustrate layout and alignment of laser assembly 104 and photo diode assembly 105 on feed-through assembly 101. FIG. 4F shows a top-down view of optical assembly 100 with photodiode assembly 105 and laser assembly 104 mounted on feed-through assembly 101. Laser 119 of laser assembly 104 is optically aligned with ball lens 110 for coupling into an optical fiber. Further, photodiode 402 is optically aligned with laser 119 to provide feedback for laser driver 106 which can be mounted in access 129. FIG. 4I is a blow-up of the area in the area designated as area 4I shown in FIG. 4F.

As shown in FIG. 4I, photodiode 402 is mounted on photodiode subassembly 401. Photodiode 402 can be, for example, an KPDE030C-15-13T InGaAs photodiode produced by Kyosemi (Kyosemi USA, 368 S. Abbott Ave, Milpitas, Calif. 95035). Typically, photodiode 402 includes two electrical connectors that provide power to photodiode 402 and from which a signal indicating the incident optical power on photodiode 402 can be determined. Photodiode 402, therefore, is mounted on conducting area 502 (see FIG. 5D) to provide one electrical contact. A wire bond to conducting area 503 is provided to form the other electrical connection for photodiode 402. Electrical connections to traces on insulating ceramic layers 121, 122, 123, and 124 are provided by the metallization 501 of photodiode subassembly 401, which is mounted on ceramic layer 121 such that the conducting traces on photodiode assembly 105 are in contact with electrical traces on ceramic layer 121.

Inductor 103 is connected by wire bonding through wire 411 to resistor area 605 and by wire 410 to traces on insulating ceramic layer 121. Ground straps 413 provide electrical and thermal connections between area 607 and areas of insulating ceramic layer 121. Laser 119 is electrically and thermally coupled through its base to area 607. Further, laser 119 is electrically coupled through wire 412 to resistor area 605.

Photodiode 402 can be aligned by an outside reticle or other externally controlled marks which can be "dialed in" to external features of the header. Markings formed on laser submount 404 can also be utilized to position laser 119.

FIG. 4H shows a magnified view of laser 119 with ball bonded wire coupling to resistor area 605. The area shown in FIG. 4H is that area designated as the area designated as area 4H in FIG. 4F. Laser fiducials 415, which can be utilized for optically aligning laser 119, are also shown in FIG. 4H.

FIG. 4G shows a view along direction designated as direction 4G—4G as illustrated in FIG. 4C. As shown in FIGS. 4F, 4G and 4I, the laser emission line and the optical axis of lens 110 need not be completely aligned. In accordance with an aspect of the present invention, cap 102 may be offset slightly so that the optical axis of ball lens 110 does not coincide completely with the laser emission. Offsetting cap 102 can allow better coupling of light out of optical assembly 101 and also allows for correction of misalignment of laser 119 during production.

In some embodiments of the invention, the facet location of laser 119 can be located by machine vision and cap 102 can be offset such that ball lens 110 is placed within a small tolerance zone of the laser emission axis. Cap offsetting in response to the position of the facets of laser 119, once mounted, can allow for much higher OSA yields than does the practice of simply bonding cap 102 to feed-through 101.

In some embodiments, offsetting of cap 102 does not need to be an active capping process, which usually involves a large amount of alignment time. Since typical tolerances of the optical design of optical assembly 100 allows for a small deviation of laser 119 relative to ball lens 110, individual optical assemblies 100 can be classified as one of several "types" on production. These individual types represent various zones of the location of the facets of laser 119 with respect to ball lens 110 after final assembly. For example, a "type 1" header might have a laser facet which is offset by 0.050 mm, for example, in a certain direction, "type 2" might indicate 0.100 mm in the same or other direction. These different types represent the most typical placement areas observed for the laser facets and a composite picture of the overlapping areas of "coverage" each "type" allows would cover nearly the entire range of laser and ball lens placements which would occur from industry-standard TO56 header assembly processes. In this way, the offset capping can be reduced to 5 or 6 "types" or "settings" such that matching their (laser facet) offset with a corresponding, pre-determined cap offset becomes practical. The offset of the cap can be accomplished via cap mandrels which have offset pockets and which are indexed to the rotational orientation of the header. The measurement of the laser facet will be made via magnified machine vision and will be taken relative to features which are later also used to locate the position of the cap prior to attachment.

Therefore, when cap 102 is attached to sealing ring 128, first the facet of laser 119 is located and optical device 100 is typed. Cap 102 is positioned and attached in accordance to the typing of optical device 100. The facet of laser 119 can be located automatically in a machine vision position tool.

Figure 7A:
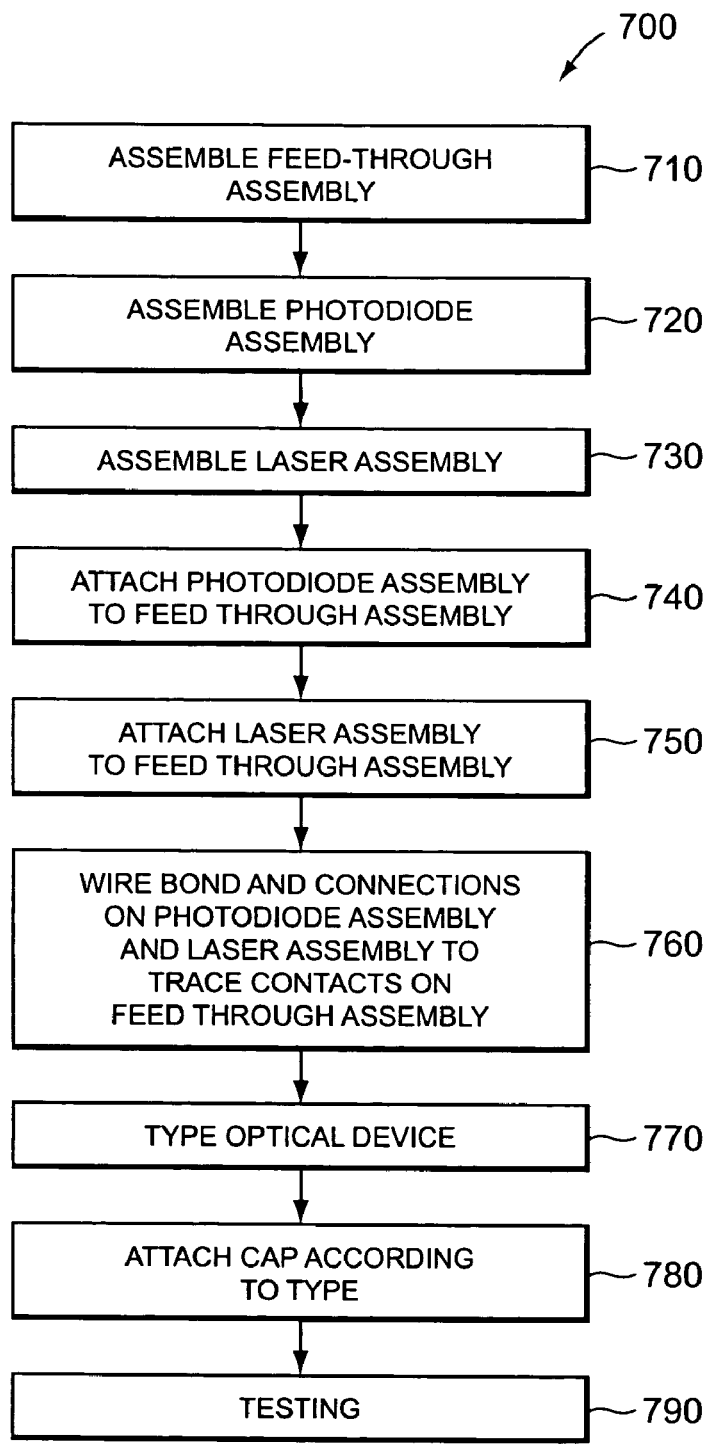
FIGS. 7A through 7I illustrate an embodiment of an assembly method for production of an optical assembly according to the present invention.

FIG. 7A shows an assembly process 700 for producing optical assembly 100 according to the present invention. In step 710, feed-through assembly 101 is assembled. Feed-through assembly 101 can be produced, for example, by Kyocera (Kyocera International, Inc., 8611 Balboa Ave, San Diego, Calif. 92123-1580), NTK (NTK Technologies, 3255-2 Scott Boulevard, Suite 101, Santa Clara, Calif. 95054), or Sumitomo (Sumitomo Corporation of America, 600 Third Ave., New York, N.Y. 10016-2001). In step 720, photodiode assembly 105 is produced. In step 730, laser assembly 104 is produced. In step 743, photodiode assembly 105 is attached to feed-through assembly 101. In step 750, laser assembly 104 is attached to feed-through assembly 101. In step 760, electrical connections between traces on feed-through assembly 101, laser assembly 104, and photodiode assembly 105 are made. In step 770, the partially assembled optical assembly 100 is typed based on the emission axis of laser 119 of laser assembly 104. In step 780, cap 102 with ball lens 110 is attached to feed-through assembly 101 based on the type determined in step 770. In step 790, optical assembly 100 can be tested. In some embodiments, certain of these steps may be rearranged. For example, steps 720 and 730 may occur in a different order. Similarly with steps 730 and 740, for example. One skilled in the art will recognize several variations of the flow chart shown in FIG. 7A.

Figure 7B:
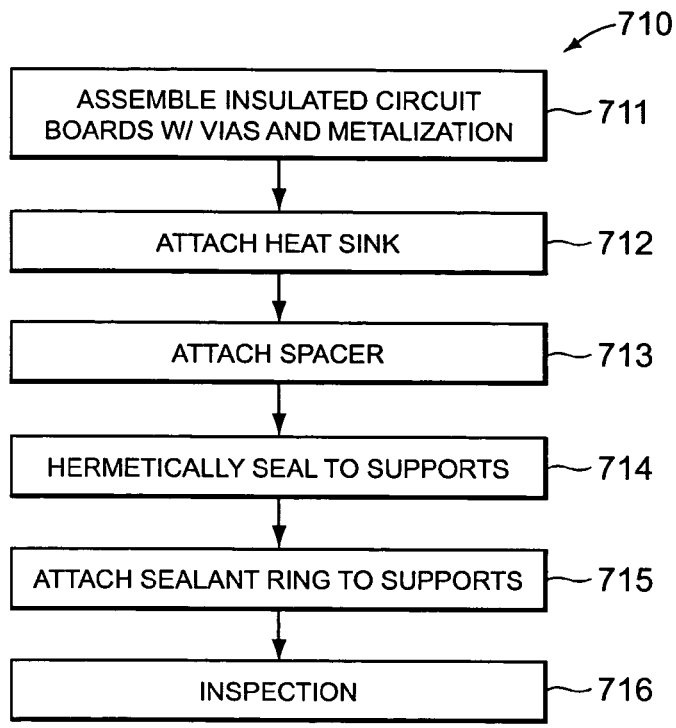

FIG. 7B illustrates an example method for performing step 710 to assemble feed-through assembly 101. In step 711, each of ceramic layers 121, 122, 123, and 124 are produced. Ceramic layers 121, 122, 123, and 124 can be formed to the appropriate shapes from a ceramic material, for example AN271 alumina tape. Further, access areas and vias can be formed in ceramic layers 121, 122, 123, and 124 to accommodate electrical and thermal conductivity throughout feed-through 101. Metallization for creating electrical traces on ceramic layers 121, 122, 123, and 124 can be formed by first depositing, for example, a layer of Kapton in certain portions (i.e., to the right of line B in FIG. 3I, for example). In the embodiment shown in FIG. 3I, between the lines labeled A and B of ceramic layer 121, a first layer of SnPb solder about 0.013 mm thick and about 0.160 mm wide is deposited on the ceramic material. A second layer of copper trace about 0.025 mm thick and about 0.160 mm wide is deposited over the first layer of SnPb solder. Finally, a top layer of, for example, Kapton about 0.025 mm thick can be deposited over the copper trace. To the left of the line marked A on FIG. 3I, a top layer of copper plating about 0.025 mm thick is placed. Metallization is formed both to conduct heat and provide electrical connectivity through feed-through 101. One skilled in the art will readily determine a number of ways to metallize ceramic layers 121, 122, 123, and 124 to achieve this purpose.

Ceramic layers 121, 122, 123, and 124 can be attached, both electrically and mechanically, to one another during cofiring. In other words, in some embodiments traces are printed on green ceramic layers 121, 122, 123 and 124 by a thick film process and then the layers are cofired together to form a cohesive, rigid, multilayered unit.

In step 712, heat sink 125 is attached to the bottom of ceramic layer 124. Heat sink 125 is attached to provide a position for the later mounting of laser assembly 104 and to provide a heat sink for a laser drive 106, which can be placed in access 129 in ceramic layer 121, in contact with ceramic layer 122. An example of the placement of heat sink 125 is shown in FIG. 3E. Heat sink 125 can be formed from any thermally conducting material, for example a copper-tungsten material (10CU90W) that can be obtained from Kyocera.

In step 713, ceramic spacer 120 can be attached by epoxy to the top of ceramic layer 121, as shown in FIG. 3B. FIG. 3B also shows the placement of ceramic spacer 120 for a particular embodiment of optical assembly 100.

In step 714, supports 127 and 126 are positioned onto spacer 120 and heat sink 125 around ceramic layers 121, 122, 123, and 124, and attached so that a hermetic seal is produced around ceramic layers 121, 122, 123, and 124. In some embodiments, supports 126 and 127 can be formed from an iron-nickel alloy, Fe—Ni50 Kovar, which can be obtained from a number of suppliers. In some embodiments, supports 126 and 127 are sealed to ceramic spacer 120, heat sink 125, and ceramic layers 121, 122, 123, and 124 by a silver copper brazing technique. In some embodiments, the He leak rate through feed-through 101 is less than about $1\times10^{-8}$ atm cc/sec. The metallization performed on ceramic layers 121, 122, 123, and 124 should not be damaged by the bonding techniques used.

In step 715, sealant ring 128 is positioned and attached to supports 126 and 127. In some embodiments, sealant ring 128 is formed of the same material as is supports 126 and 127 and is bonded to supports 126 and 127 concurrently with the bonding of supports 126 and 127 to spacer 120, ceramic layers 121, 122, 123, and 124, and heat sink 125.

In step 716, feed-through assembly 101 is inspected. Inspection of feed-through assembly 101 can include a visual inspection through a microscope to check for blistering or discoloration of the metallization. Inspection step 716 may also include electrical tests to check the electrical connectivity of various metallization traces through feed-through 101.

Figure 7C:
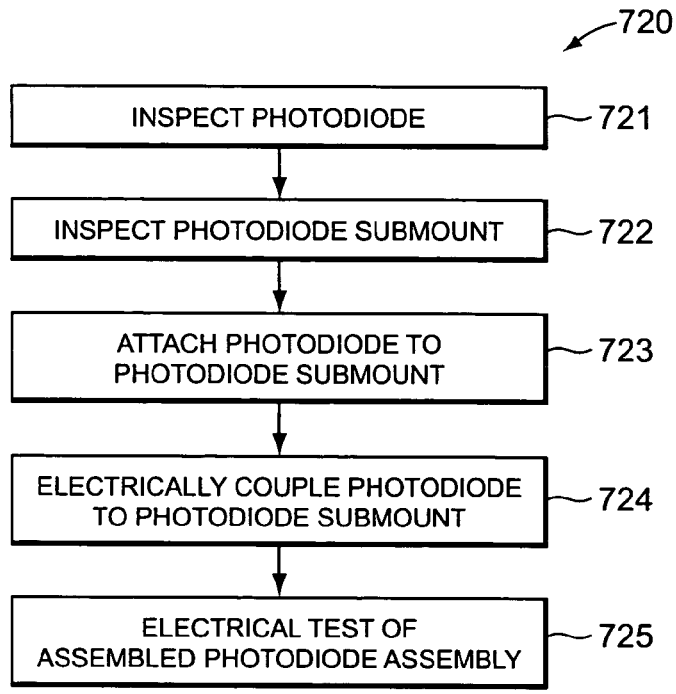

FIG. 7C illustrates assembly of photodiode assembly 104. In step 721, photodiode 402 can be inspected. Photodiode 402 can, for example, be an InGaAs PIN diode or any other device which provides an electrical signal in response to light incident on a surface of photodiode 402. Inspection of photodiode 402 can include a visual inspection, for example with a 10-100x microscope.

In step 722, photodiode submount 401 can be inspected. Submount 401, as illustrated in the embodiment shown in FIGS. 5A through 5E, can be formed from alumina or other insulating material, such as AlN or BeO, for example. Submount 401 is metalized to provide electrical connections to photodiode 402. Inspection step 722 can include a visual inspection, for example, with a 10-100x microscope, of the metallization as well as the material of submount 401. Submount 401, with metallization as described here, can be obtained from Stellar Industries (Stellar Industries Corp., 225 Viscoloid Ave., Leominster, Mass. 01453-4388), ATP (Advanced Thermal Products, Inc., P.O. Box 249, 328 Ridgeway Rd., St. Marys, Pa. 15857), NTK, or Kyocera.

In step 723, photodiode 402 is positioned on photodiode submount 401 and fixed to photodiode submount 401. As shown in FIGS. 4I and 5D, photodiode 401 is also electrically coupled to region 502 of metallization on photodiode submount 401. In some embodiments, photodiode 402 is attached to region 502 of submount assembly 401 with a silver epoxy or glass+paste. After visual inspection, for example with a 10-100× microscope, the silver paste epoxy, for example Epotek H20E (Epoxy Technology, 14 Fortune Dr., Billerica, Mass. 01821), can be cured. Epotek H20E, for example, is cured by heating for about 30 minutes at a temperature less than about 150° C. In some embodiments, photodiode 402 can be attached to submount 401 attached with Ag-filled glass preforms or paste. Such paste is also manufactured by Ablestik (Ablestik Laboratories, 20021 Susana Rd., Rancho Dominquez, Calif. 90221) (e.g., 2105S) and DieMat (Diemat, Inc., 19 Central St., Byfield, Mass. 01922) (e.g., DM2700PF).

In step 724, photodiode 402 is further electrically connected to metallization deposited on submount 401. In some embodiments, a gold ball bonding technique can be utilized to attach a wire between a connection on the front of photodiode 402 to metallization region 503 on submount 401. Once photodiode 402 is mounted and electrically connected to the metallization traces formed on photodiode subassembly 401, photodiode assembly 105 is formed.

In step 725, electrical testing of photodiode assembly 105 can be performed. In some embodiments, a burn-in with a voltage of about 2V at a temperature of about 100° C. for about 96 hours can be performed. Other embodiments of the invention may utilize different procedures for testing photodiode assembly 105 electrically.

Figure 7D:
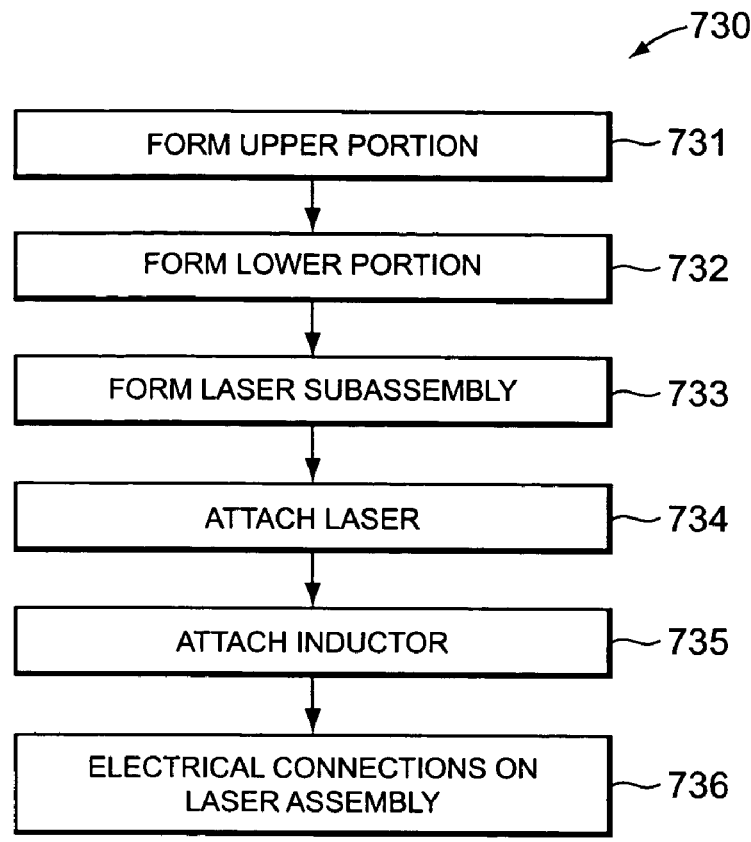

FIG. 7D illustrates step 730 of process 700, forming laser assembly 104. In step 731, upper portion 601 is formed and metallization is added. In embodiments as shown in FIGS. 6A through 6F, a resistor region 605 is formed with a thin film resistor material deposited in resistor region 605 to form resistor 109 as shown in FIG. 1B. Further, vias 606 are formed to provide electrical and thermal contact to bottom portion 602. In some embodiments, upper portion 601 can be formed from aluminum nitride (AN271) and metallization can be formed from a first layer of Ti about 0.1 micron thick covered by a layer of lead about 0.2 micron thick and further covered by a layer of gold about 1.5 micron thick. Other metallizations can also be utilized. Further, in some embodiments region 603 can also include a layer of platinum 0.5 micron thick deposited over the gold layer and a layer of gold-tin solder about 4.0 micron thick.

In step 732, bottom region 602 can be formed. Bottom region 602 can be formed of an insulating material which is metallized on the top surface to provide electrical and thermal contact through vias 606 of top portion 601. Further, the bottom surface of bottom region 602 can be metallized to provide thermal and electrical contact when mounted on heat sink 125. In some embodiments, bottom region 602 can be formed of aluminum nitride (AN271) metallized with the same materials as were used for upper region 601.

In step 733, laser subassembly is formed by positioning upper portion 601 on bottom portion 602 and bonding them together. Upper portion 601 can then be cofired with bottom region 602 to form laser subassembly 404. Cofiring is the process by which "unfired" or "green" ceramic layers are sandwiched together and are brought to elevated temperature under pressure. This procedure fuses the ceramic layers together to form an integral, multi-layered part. The conductive traces which were applied to the ceramic prior to the cofiring process maintain their conductivity and function as a printed wire board.

In step 734, laser 119 is attached to region 603 of upper portion 601. Laser 119 can be attached, for example, by bonding to the gold-tin solder deposited in region 603. Bonding can be achieved by heating the assembly for a period of time, for example to about 300° C. for 30 minutes.

In step 735, inductor 103 is epoxied to region 604 of upper portion 601. Finally, in step 736 electrical connections between laser 119 and the thin film resistor deposited in resistor region 605 and connections between inductor 103 and the thin film resistor deposited in resistor region 605 can be accomplished by a gold ball bonding method.

Figure 7E:
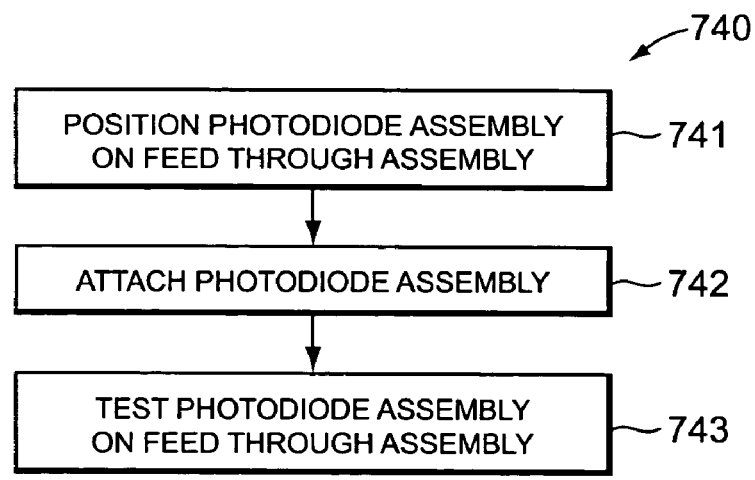

FIG. 7E illustrates an example of step 740 shown in FIG. 7A. In step 741, photodiode assembly 105 is positioned on ceramic layer 121. In step 742, photodiode assembly 105 can be attached to and electrically coupled to traces on ceramic layer 121 of feed-through 101 with a Ag paste epoxy (e.g., Epotek H20E). Curing of the epoxy may be accomplished, for example, by heating for about 30 minutes at low temperature (e.g., less than about 150° C.). In step 743, photodiode assembly 105 is tested on feed-through assembly 101. For example, a visual inspection through a 10-100× microscope can be performed. Additionally, a dark current check can be performed. In some embodiments, the dark current from photodiode 402 should be less than about 100 nA.

Figure 7F:
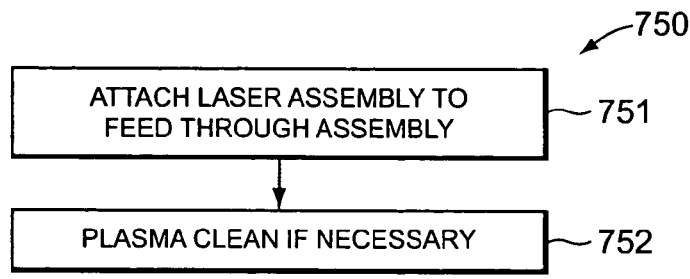

FIG. 7F shows an example of step 750 shown in FIG. 7A. In step 750, laser assembly 104 is attached to heat sink 125 of feed-through assembly 101. In some embodiments, laser assembly 104 is attached through a Ag epoxy or with a Au—Sn solder. In step 752, a plasma cleaning process can also be performed in preparation for performing ball-bonding.

Figure 7G:
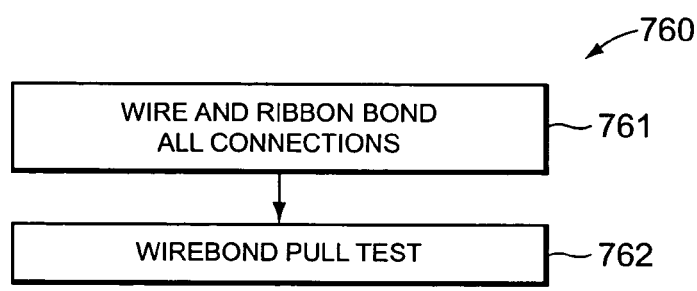

FIG. 7G illustrates step 760 shown in FIG. 7A. In step 761, ribbon bands 413, wires 410, and possibly wires 411 and 412 are attached, for example by ball bonding. As shown in FIG. 7F, a plasma cleaning process may be performed prior to the ball bonding step. In step 762, a wire pull test may be performed. In a wire pull test, each of ribbon bands 413 and wires 410, 411, 412 and others are pulled slightly to ensure that they are firmly bonded.

Figure 7H:
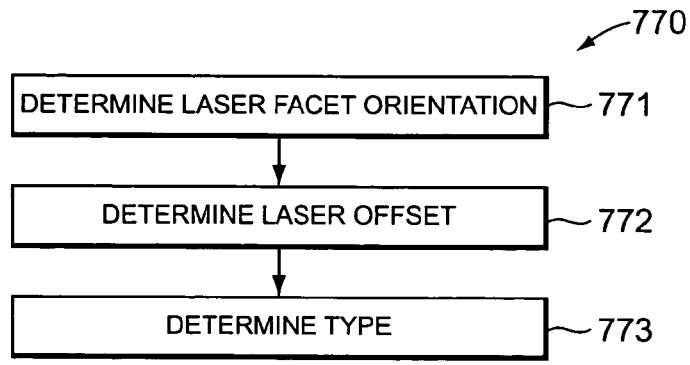

FIG. 7H shows an example of step 770 of FIG. 7A. In step 771, laser facet location and orientation of laser 119 on laser assembly 104 is determined. Facet location and orientation can be determined, for example, by reflecting an optical beam from the laser surface and measuring the reflected beam. Other machine vision techniques for determining the facet location and orientation of laser 119 can also be used. In some embodiments, laser fiducial marks (see marks 415 shown in FIG. 4H) can be utilized to determine facet location and orientation. In step 772, the laser emission axis offset is determined from the location and orientation of the laser facet. Once the laser emission axis is determined, in step 773 optical assembly 101 can be classified as belonging to a particular type. For example, "type 1" may indicate that the laser facet is offset by a certain distance in a first direction while "type 2" may indicate that the laser facet is offset by a certain distance in the opposite direction. There may be any number of types, and there should be a sufficient number of different types in the classification to allow cap 102 to be positioned within the allowable tolerances required of optical assembly 101.

Figure 7I:
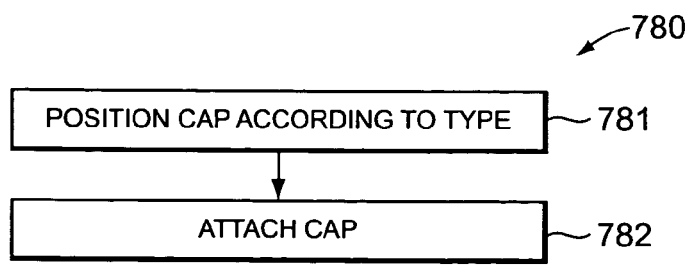

FIG. 7I illustrates an example of step 780 of FIG. 7A. In step 780, cap 102 is positioned according to type in step 781 and attached to sealant ring 128 in step 782. In step 781, cap 102 is positioned in order to focus the light emission from laser 119 to couple with an optical fiber. From the type of optical assembly 100, the position of cap 102 can be determined. Therefore, based on type, cap 102 is positioned relative to laser 119. In step 782, cap 102 is attached, for example by brazing, to sealant ring 128.

In step 790 shown in FIG. 7A, optical assembly 100 is tested. For example, a leakage test to ensure that the area between cap 102 and sealant ring 128 is sealed can be performed. In some embodiments, a He leak of less than about $5 \times 10^{-8}$ atm cc/sec should be attained. Further, electronic testing can be performed. Further, a burn-in step can be performed. For example, a current of 50 mA to laser 119 at a temperature of about 100° C. for about 96 hours can be performed. A second set of electronic tests, for example LIV testing, can be performed. LIV testing is a standard DC test of laser performance involving testing the light output (L) of the laser at various currents (I) and voltages (V) and is typically performed over a range of temperatures. Finally, a high speed data test can be performed by modulating laser 119 at a particular rate and monitoring the emissions through lens 110.

One skilled in the art will recognize numerous variants based on the embodiments of the invention disclosed here. These variants are considered within the scope and spirit of this disclosure. Further, several of the figures include numerical dimensions that are intended to illustrate a particular embodiment of the invention and are not intended to be generally limiting. As such, the invention is limited only by the following claims.

We claim:

1. An optical assembly, comprising:
   a feed-through assembly, the feed-through assembly including an access mount for a laser driver, a heat sink, a layered ceramic assembly, and a sealant ring formed around the layered ceramic assembly and the heat sink, the sealant ring forming a hermetic seal with the layered ceramic assembly and the heat sink;
   a laser assembly mounted on the heat sink,
   wherein the access mount for the laser driver and the laser assembly are both thermally coupled to the heat sink, and
   the access mount for the laser driver is formed in the layered ceramic assembly, and the heat sink is mounted to the layered ceramic assembly on the side opposite the access mount to the layered ceramic assembly.

2. The assembly of claim 1, wherein the sealant ring includes a spacer mounted on the layered ceramic assembly, at least one support that can be formed around and sealed to the layered ceramic assembly, the heat sink, and the spacer, and a sealant ring attached to the at least one support.

3. The assembly of claim 1, wherein the layered ceramic assembly includes at least one layer of ceramic insulator metallized to form a electrical connections between the laser driver mounted in the access mount for the laser driver and the laser assembly.

4. The assembly of claim 1, wherein the laser assembly is mounted directly on the heat sink.

5. The assembly of claim 4, wherein the laser assembly includes a laser, a spiral inductor, and a resistor.

6. The assembly of claim 5, wherein the spiral inductor and resistor are chosen to match an output impedance of the laser driver to an input impedance of the laser.

7. The assembly of claim 1, further including a photodiode coupled opposite a laser of the laser assembly, the photodiode being electrically coupled to provide feedback signals to a laser driver mounted in the access mount for the laser driver.

8. The assembly of claim 1, further including a cap with a ball lens connected to the sealant ring, wherein the laser driver is enclosed between the cap and the sealant ring.

9. The assembly of claim 8, wherein the cap is positioned according to a type, wherein the type represents various zones of the location of the laser beam with respect to the feed-through assembly.

10. A method of producing an optical assembly, comprising:
    forming a feed-through assembly, including assembling insulating ceramic layers, the feed-through assembly including an access for a laser driver formed in the assembled insulating ceramic layers wherein the laser driver will be thermally coupled to a heat sink;
    forming a laser assembly;
    mounting the laser assembly on the feed-through assembly such that the laser assembly is thermally coupled to the heat sink;
    attaching the heat sink to the assembled insulating ceramic layers on the side opposite the access;
    sealing supports to the insulating ceramic layers and the heat sink; and
    attaching a sealant ring to the supports.

11. The method of claim 10, wherein assembling insulating ceramic layers include metallizing at least one insulating ceramic layer and cofiring the at least one insulating ceramic layer to form a single unit.

12. The method of claim 10, wherein forming the laser assembly includes forming a submount, mounting a laser on the submount, and mounting a spiral inductor on the submount.

13. The method of claim 12, wherein a resistor formed on the submount and the spiral inductor are chosen to match an output impedance of the laser driver with the input impedance of the laser.

14. An optical assembly, comprising:
    means for electrically coupling a laser driver to a laser assembly with a feed-through assembly, the feed-through assembly including a layered ceramic assembly, an access mount for a laser driver formed in the layered ceramic assembly, and a heat sink mounted to the layered ceramic assembly on the side opposite the access mount to the layered ceramic assembly; and
    means for thermally coupling the laser driver and the laser assembly to a heat sink.

15. The assembly of claim 14, further including means for coupling laser emission from the laser assembly to an optical fiber.

16. The assembly of claim 15, wherein the means for coupling laser emission includes means for sealing the laser assembly within a hermetic seal.

17. The assembly of claim 14, wherein the means for electrically coupling a laser driver to a laser assembly includes means for providing impedance matching between the laser driver and a laser on the laser assembly.

* * * * *